United States Patent
Baburske et al.

(10) Patent No.: US 12,249,551 B2
(45) Date of Patent: Mar. 11, 2025

(54) POWER SEMICONDUCTOR DEVICE

(71) Applicant: Infineon Technologies AG, Neubiberg (DE)

(72) Inventors: Roman Baburske, Otterfing (DE); Moritz Hauf, Munich (DE); Hans-Joachim Schulze, Taufkirchen (DE); Holger Schulze, Villach (AT); Benedikt Stoib, Feldkirchen-Westerham (DE)

(73) Assignee: Infineon Technologies AG, Neubiberg (DE)

( * ) Notice: Subject to any disclaimer, the term of this patent is extended or adjusted under 35 U.S.C. 154(b) by 484 days.

(21) Appl. No.: 17/741,527

(22) Filed: May 11, 2022

(65) Prior Publication Data

US 2022/0375811 A1 Nov. 24, 2022

(30) Foreign Application Priority Data

May 19, 2021 (DE) .......................... 102021002618.7

(51) Int. Cl.
*H01L 23/367* (2006.01)
*H01L 27/07* (2006.01)
*H01L 29/78* (2006.01)
*H01L 29/861* (2006.01)
*H01L 29/739* (2006.01)

(52) U.S. Cl.
CPC ........ *H01L 23/367* (2013.01); *H01L 27/0727* (2013.01); *H01L 29/7811* (2013.01); *H01L 29/861* (2013.01); *H01L 29/7397* (2013.01); *H01L 29/7813* (2013.01)

(58) Field of Classification Search
None
See application file for complete search history.

(56) References Cited

U.S. PATENT DOCUMENTS

2017/0125560 A1* 5/2017 Voss .................... H01L 29/0615
2020/0091283 A1* 3/2020 Matsushita ........... H01L 29/868
(Continued)

FOREIGN PATENT DOCUMENTS

| DE | 102014101130 A1 | 7/2014 |
|---|---|---|
| DE | 102015102129 A1 | 8/2015 |
| WO | 2015097157 A1 | 7/2015 |

*Primary Examiner* — Cory W Eskridge
(74) *Attorney, Agent, or Firm* — Murphy, Bilak & Homiller, PLLC

(57) ABSTRACT

A power semiconductor device includes, an active area that conducts load current between first and second load terminal structures, a drift region, and a backside region that includes, inside the active area, first and second backside emitter zones one or both of which includes: first sectors having at least one first region of a second conductivity type contacting the second load terminal structure and a smallest lateral extension of at most 50 μm; and/or second sectors having a second region of the second conductivity type contacting the second load terminal structure and a smallest lateral extension of at least 50 μm. The emitter zones differ by at least of: the presence of first and/or second sectors; smallest lateral extension of first and/or second sectors; lateral distance between neighboring first and/or second sectors; smallest lateral extension of the first regions; lateral distance between neighboring first regions within the same first sector.

21 Claims, 16 Drawing Sheets

(56) References Cited

U.S. PATENT DOCUMENTS

2020/0194550 A1* 6/2020 Baburske .......... H01L 21/26513
2020/0357883 A1* 11/2020 Pfaffenlehner ..... H01L 29/0626
2021/0193800 A1* 6/2021 Baburske ............ H01L 29/7802

* cited by examiner

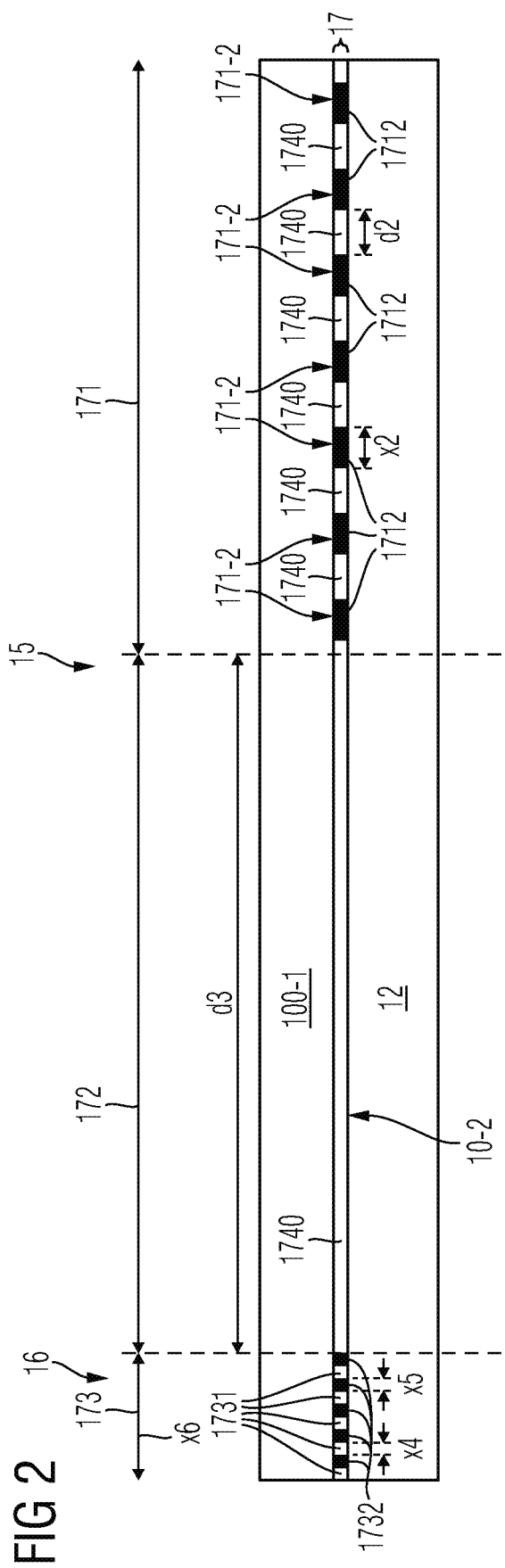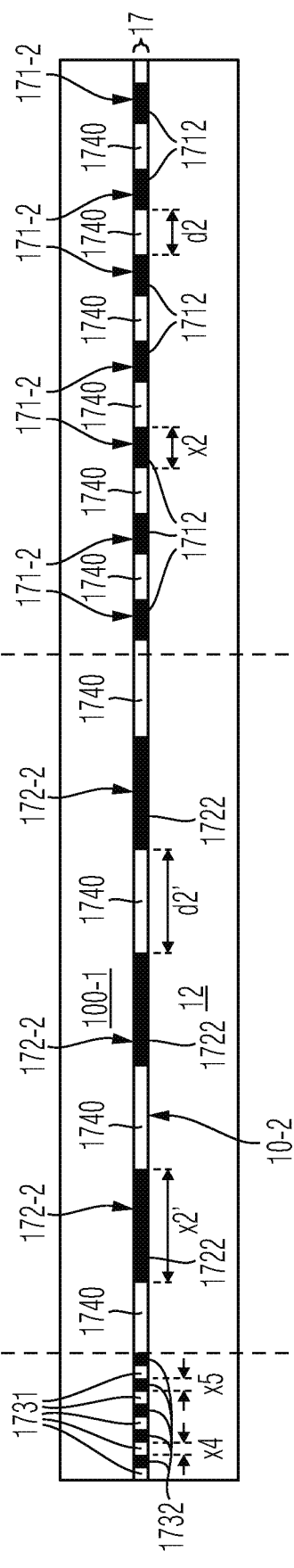

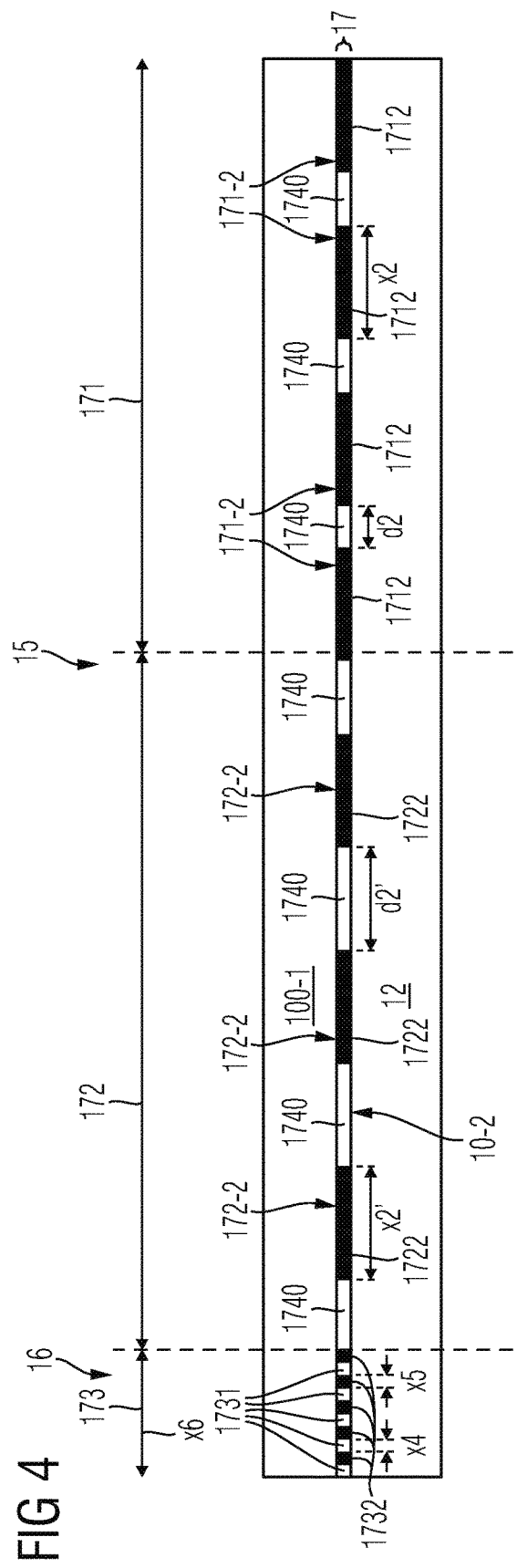
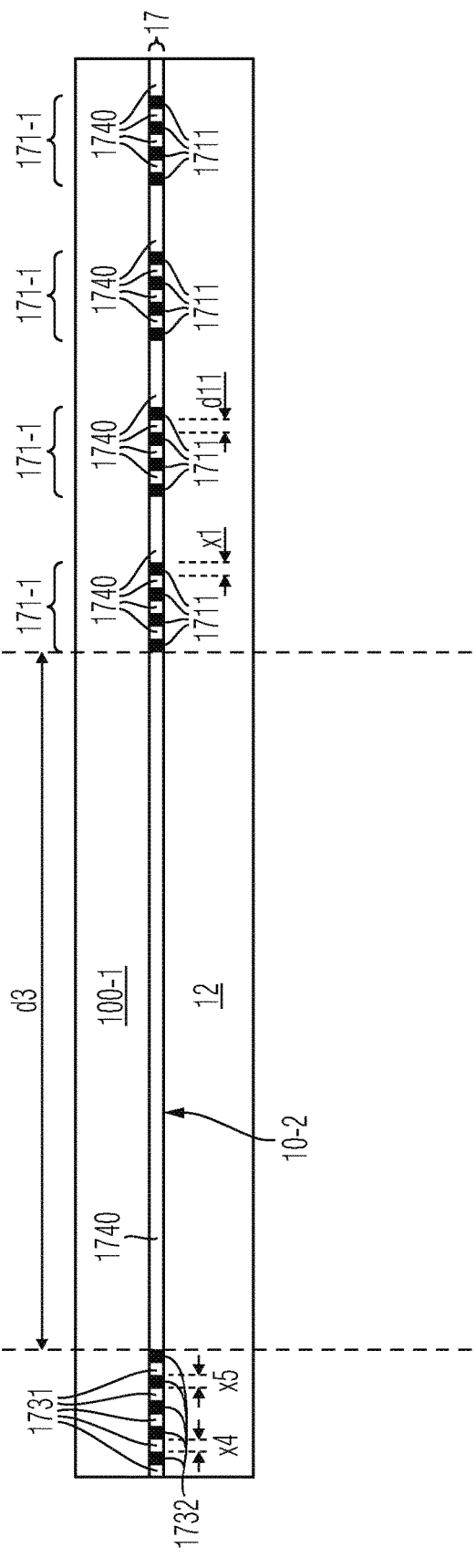
FIG 4
FIG 5

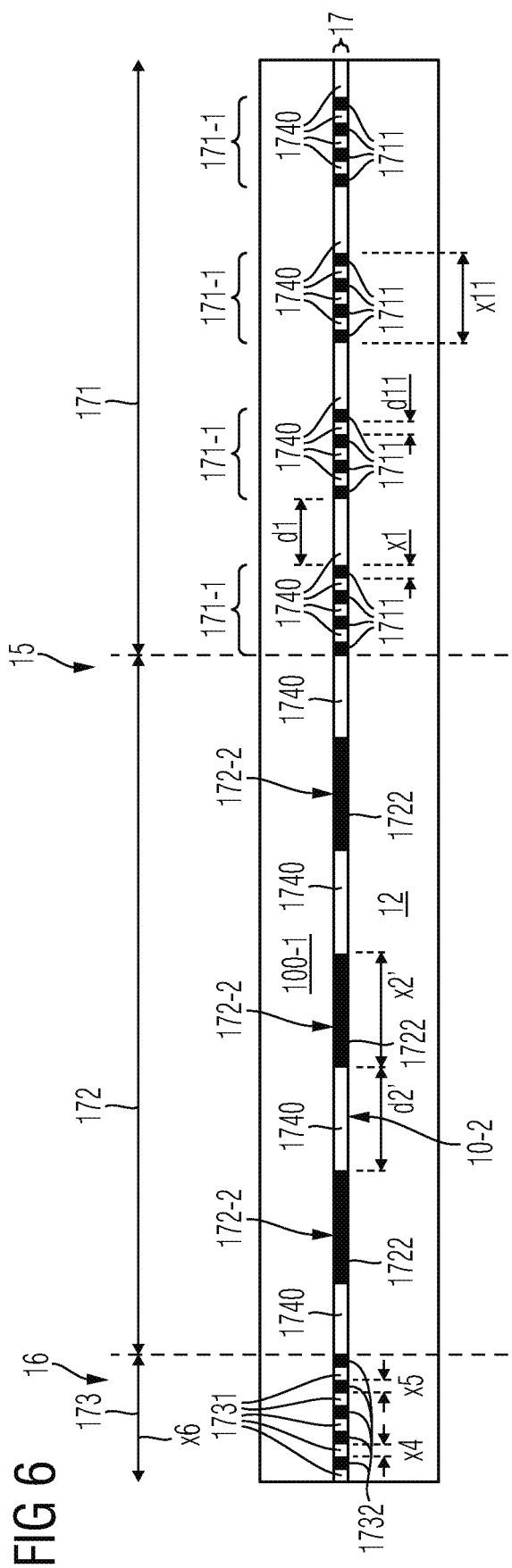
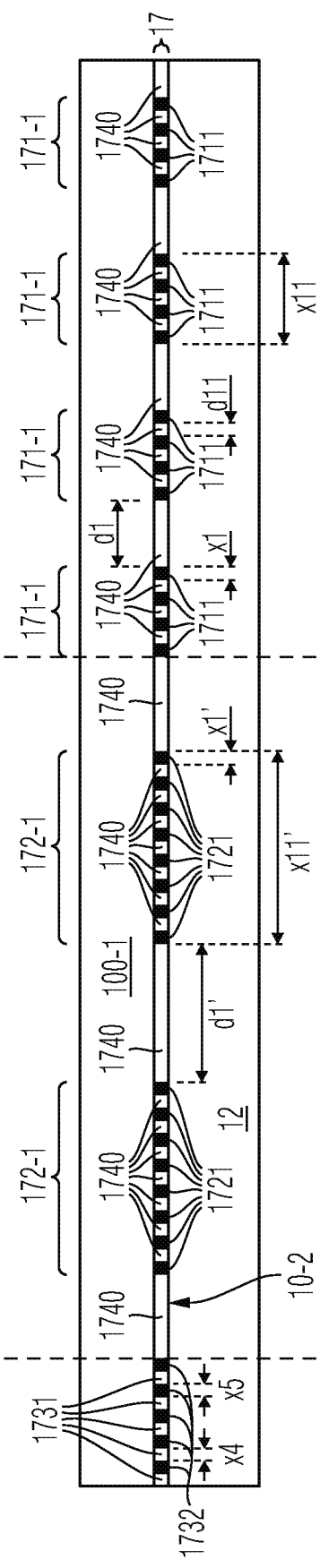
FIG 6
FIG 7

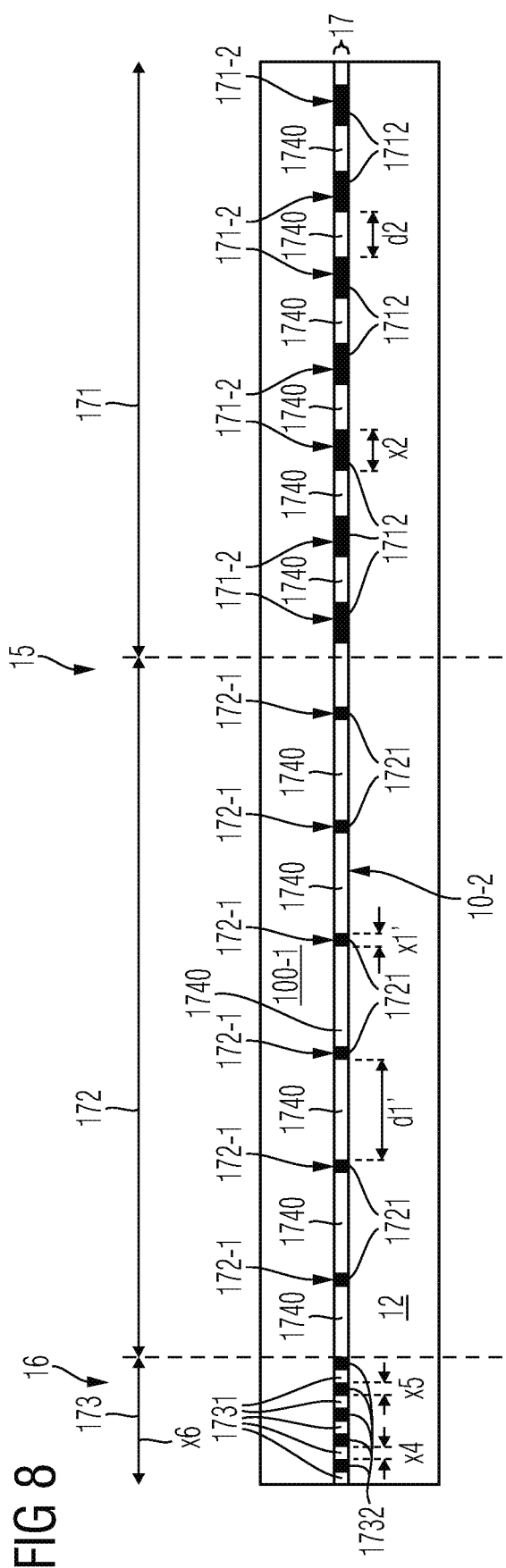
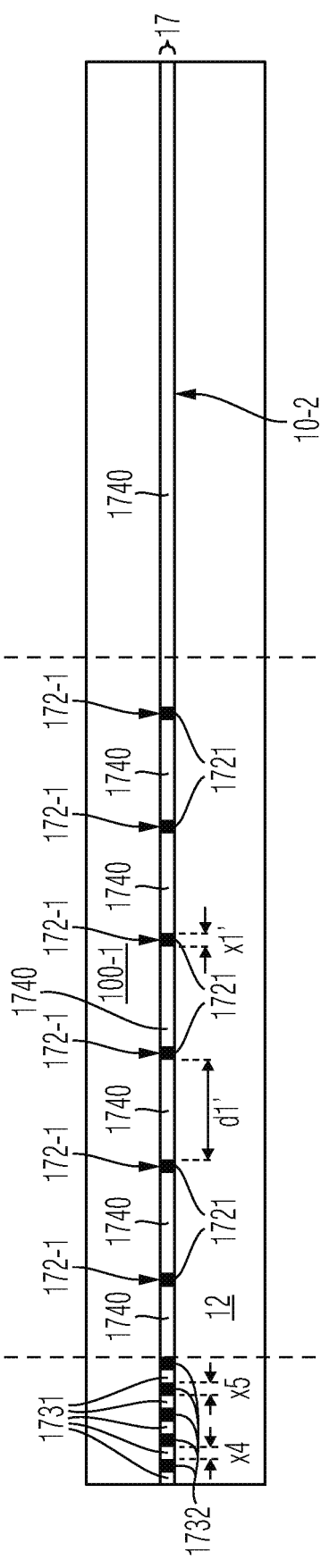

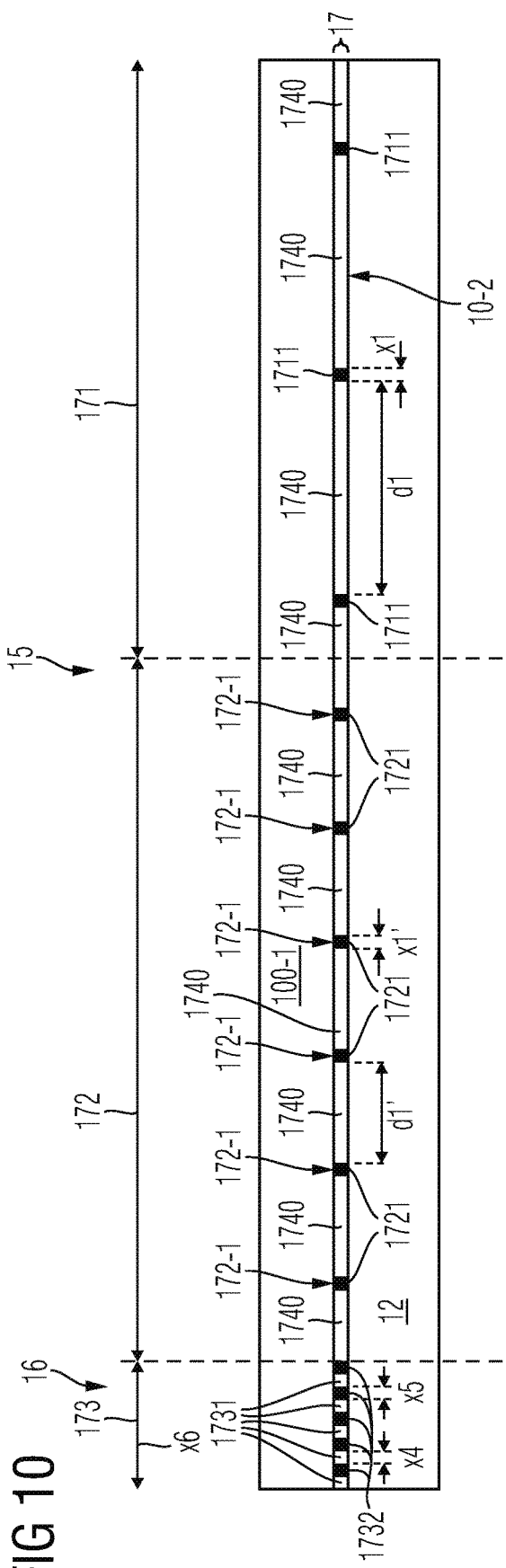
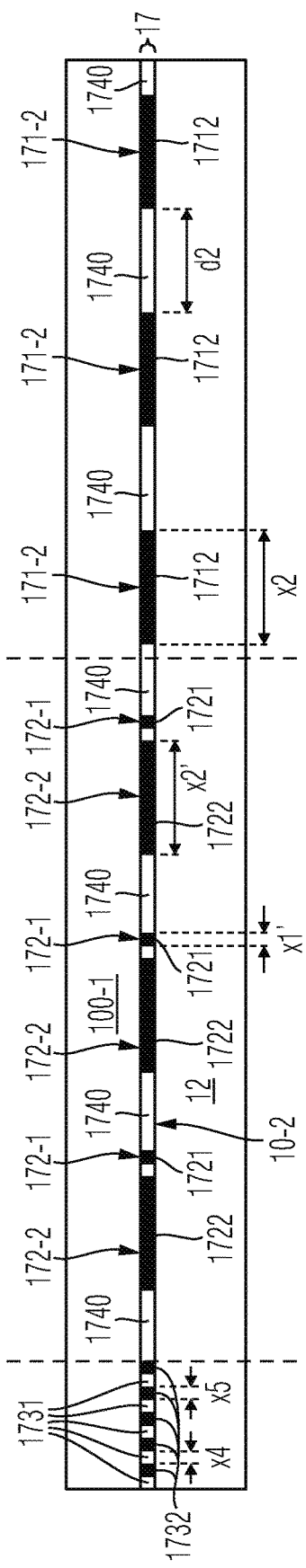

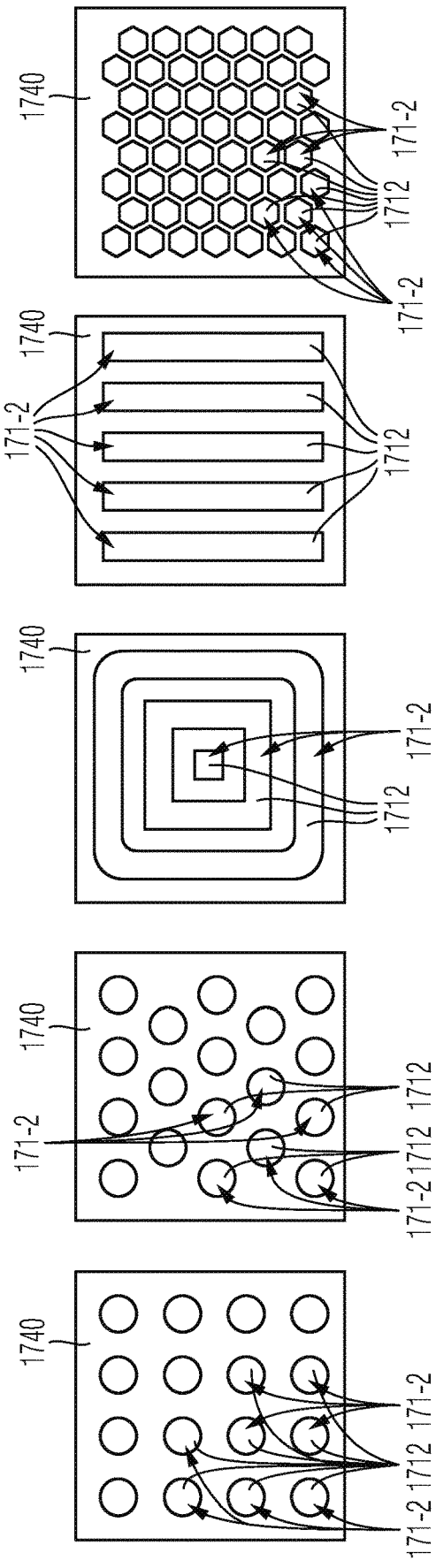

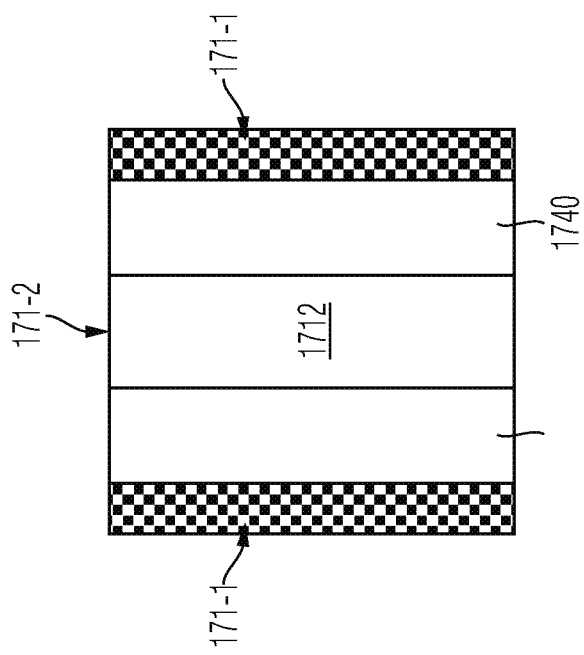
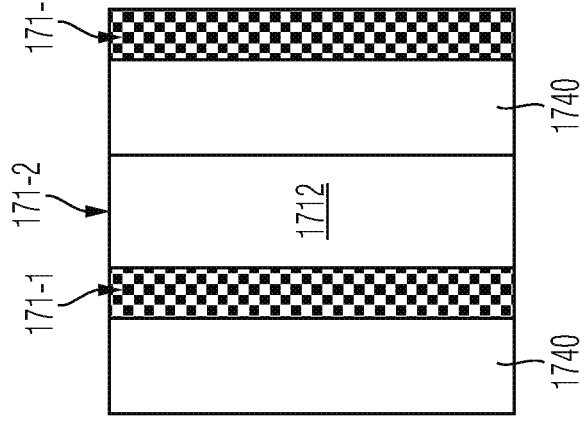
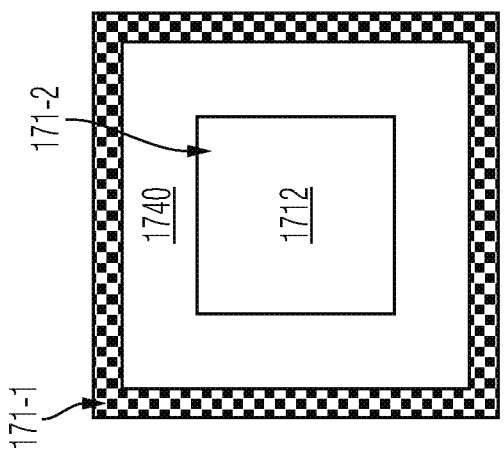

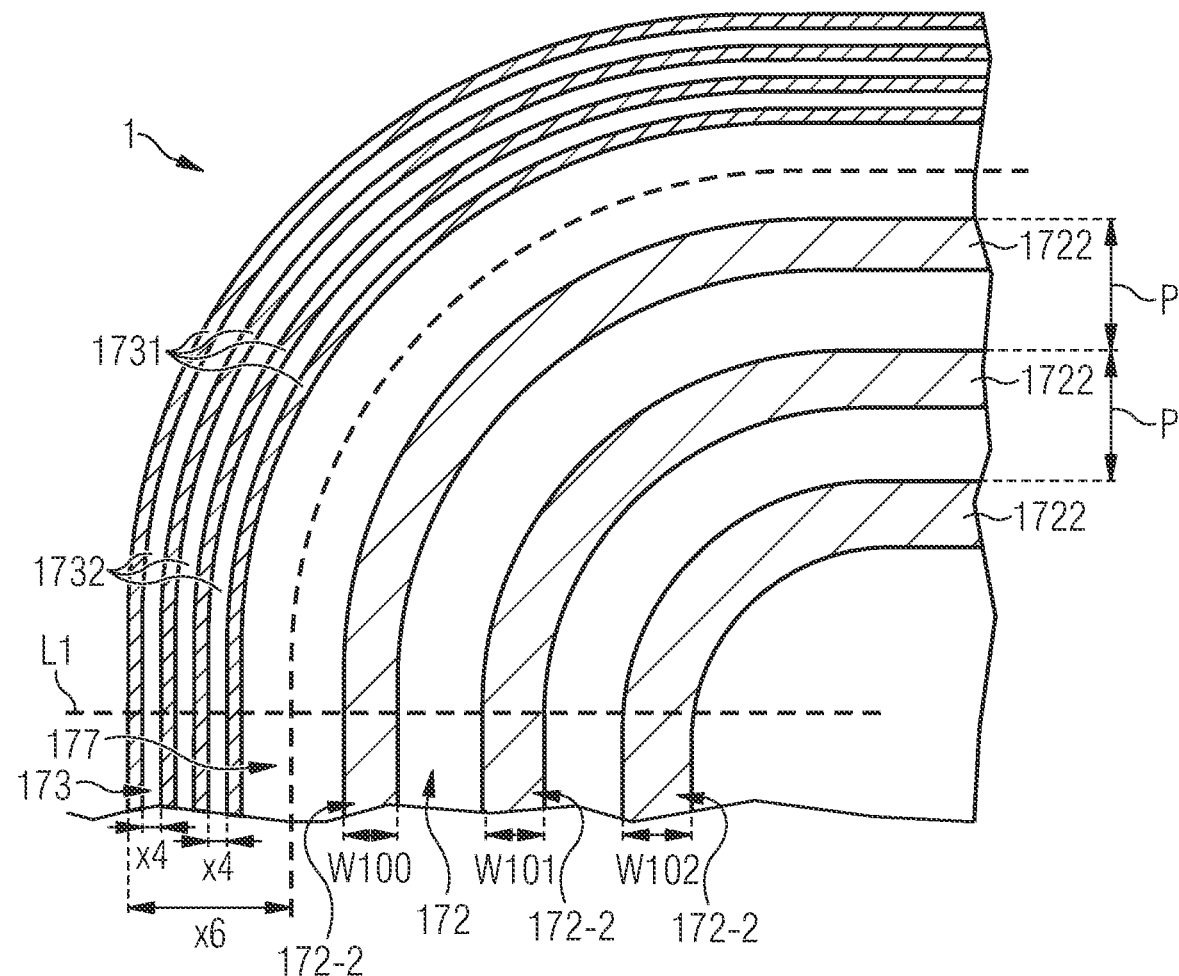

POWER SEMICONDUCTOR DEVICE

TECHNICAL FIELD

This specification refers to embodiments of a power semiconductor device. In particular, this specification refers to aspects of a power semiconductor device having one or more backside emitter zones included in a semiconductor body, wherein the backside emitter zones exhibit different emitter efficiencies and/or different injection efficiencies.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body with an active area configured to conduct a load current along a load current path between two load terminals of the device. During operation of such a power semiconductor device, a spatial temperature distribution in the semiconductor body generally tends to be inhomogeneous, exhibiting, e. g., a maximum at the center of the active area. As a consequence, a power cycling reliability and a thermal short circuit or surge current withstand capability of the power semiconductor device may be reduced, which may necessitate the provision of costly safety margins in the thermal design of the power semiconductor device.

It is thus desirable to influence, for example homogenize, the temperature distribution in the semiconductor body of a power semiconductor device, so as to increase the device reliability. Further, it may be desirable to improve a tradeoff between softness and power losses of a power semiconductor device.

SUMMARY

Aspects described herein relate to a specific novel design of a backside region of a power semiconductor device that may, for example, yield an improved thermal robustness and an improved tradeoff between softness and power losses as compared to conventional designs.

According to an embodiment, a power semiconductor device comprises: a semiconductor body having a front side and a backside; a first load terminal structure being coupled to the front side and a second load terminal structure being coupled to the backside; an active area of the semiconductor body being configured for conducting a load current between the first load terminal structure and the second load terminal structure; a drift region of the semiconductor body, the drift region having a first conductivity type and being configured for conducting the load current; a backside region of the semiconductor body, the backside region being arranged at the backside and comprising, inside the active area, a first backside emitter zone and a second backside emitter zone. The first backside emitter zone is arranged within the active area with greater distance to an outer border of the active area than the second backside emitter zone. Therefore, the first backside emitter zone may exhibit a greater distance to a non-active area, e.g. an edge termination region, of the power semiconductor device, the non-active area laterally surrounding the active area, than the second backside emitter zone. The first backside emitter zone comprises a plurality of first sectors each comprising at least one first region of a second conductivity type, the first region being arranged in contact with the second load terminal structure. In other words, each of the first sectors may either comprise a plurality of first regions or each of the first sectors may consist of only one first region. The second backside emitter zone comprises a plurality of second sectors each comprising at least one second region of the second conductivity type, the second regions being arranged in contact with the second load terminal structure. In other words, each of the second sectors may either comprise a plurality of second regions or each of the second sectors may consist of only one second region. A pitch, which is defining a lattice constant along at least a first lateral direction, is at least essentially equal in the first backside emitter zone and the second backside emitter zone. The first backside emitter zone differs from the second backside emitter zone in a smallest lateral extension of the first sectors being greater than a smallest lateral extension of the second sectors. Alternatively or additionally, the first backside emitter zone may differ from the second backside emitter zone in a smallest lateral extension of the first regions being greater than a smallest lateral extension of the second regions.

According to another embodiment, a power semiconductor device comprises: power semiconductor device, comprising: A semiconductor body having a front side and a backside, a first load terminal structure being coupled to the front and a second load terminal structure being coupled to the backside; an active area of the semiconductor body being configured for conducting a load current between the first load terminal structure and the second load terminal structure; a drift region of the semiconductor body, the drift region having a first conductivity type and being configured for conducting the load current; a backside region of the semiconductor body, the backside region being arranged at the backside and comprising, inside the active area, a second backside emitter zone. The second backside emitter zone comprises a plurality of second sectors each comprising at least one second region of the second conductivity type, the second regions being arranged in contact with the second load terminal structure. Therein, along a thought line, for at least three or at least five, or least eight neighboring second sectors, their smallest lateral extension is increasing strictly monotonically. In other words, the at least three neighboring second sectors are arranged along the thought line, wherein their smallest lateral extension is increasing strictly monotonically along the thought line. A middle second sector of the at least three neighboring second sectors, which may be arranged in between to surrounding second sectors of the at least three neighboring second sectors, may exhibit a smallest lateral extension smaller than one of the surrounding second sectors and greater than the other one of the surrounding second sectors. The thought line may a straight line. The second sectors may be arranged according to a lattice with a pitch defining a lattice constant along at least a first lateral direction, wherein the pitch may be at least essentially constant for the at least three neighboring second regions along the thought line. The smallest lateral extension of the at least three neighboring second regions may be increasing with increasing distance to an outer border of the active area. In other words, the at least three neighboring second regions may have a bigger size with respect to their smallest lateral extension the more they a spaced from the border of the active area or an non-active area laterally surrounding the active area.

According to yet another embodiment, a power semiconductor device comprises: A semiconductor body having a front side and a backside; a first load terminal structure being coupled to the front side and a second load terminal structure being coupled to the backside; an active area of the semiconductor body being configured for conducting a load current between the first load terminal structure and the second load terminal structure; a drift region of the semiconductor body, the drift region having a first conductivity type and being configured for conducting the load current; a backside region of the semiconductor body, the backside region being arranged at the backside and comprising, inside the active area, a first backside emitter zone and a second backside emitter zone, wherein the first backside emitter zone comprises a plurality of first sectors each comprising at least one first region of a second conductivity type, the first region being arranged in contact with the second load terminal structure; and wherein the second backside emitter zone comprises a plurality of second sectors each comprising at least one island region of the second conductivity type, the island region being insulated from the second load terminal structure. The first backside emitter zone differs from the second backside emitter zone in the island regions being isolated from the second load terminal and the first regions being connected to the second load terminal. "Being insulated" means, that there is no ohmic connection between the respective island regions and the second load terminal. For example, a portion of the first conductivity type or a portion of an insulating material may be arranged between the island regions and the second load terminal. For example, island regions may be omitted in the first backside emitter zone. For example, no island regions may be arranged in the first backside emitter zone. For example, first regions may be omitted in the second backside emitter zone. For example, no first regions may be arranged in the second semiconductor zone. For example the first backside emitter zone may be arranged within the active area with greater distance to an outer border of the active area than the second backside emitter zone. Therefore, the first backside emitter zone may exhibit a greater distance to a non-active area, e.g. an edge termination region, of the power semiconductor device, the non-active area laterally surrounding the active area, than the second backside emitter zone. A pitch defining a lattice constant along at least a first lateral direction may be at least essentially equal in the first backside emitter zone and the second backside emitter zone. Alternatively, the pitch may be different in the first backside emitter zone and the second backside emitter zone.

For example, the first regions may have a smallest lateral extension of at most 50 μm and/or the second regions may have a smallest lateral extension of at least 50 μm.

For example, a lateral distance between neighboring first sectors in the first backside emitter zone may be at maximum three times the smallest lateral extension of the first sector and/or a lateral distance between neighboring second sectors in the second backside emitter zone may be at maximum three times the smallest lateral extension of the second sectors.

The first backside emitter zone may exhibit each of a first emitter efficiency and a first injection efficiency and the second backside emitter zone may exhibit each of a second emitter efficiency and a second injection efficiency at a nominal current of the power semiconductor device. According to an embodiment, the first emitter efficiency differs from the second emitter efficiency by at least 1% or even by at least 3% or even by at least 10% and/or the first injection efficiency differs from the second injection efficiency by at least 1% or even by at least 3% or even by at least 10%.

For example, the above-stated relation between the first injection efficiency and the and second injection efficiency may refer to the first and second injections efficiencies at a current amounting to 0.1 times a nominal current of the power semiconductor device.

Alternatively, the above-stated relation between the first injection efficiency and the second injection efficiency may refer to the first and second injections efficiencies at a nominal current of the power semiconductor device or at twice the nominal current of the power semiconductor device.

According to a further embodiment, a power semiconductor device comprises: a semiconductor body having a front side and a backside; a first load terminal structure being coupled to the front side and a second load terminal structure being coupled to the backside; an active area of the semiconductor body being configured for conducting a load current between the first load terminal structure and the second load terminal structure; a drift region of the semiconductor body, the drift region having a first conductivity type and being configured for conducting the load current; a backside region of the semiconductor body, the backside region being arranged at the backside and comprising, inside the active area, a first backside emitter zone and a second backside emitter zone, wherein each of the first backside emitter zone and the second backside emitter zone comprises a plurality of regions of a second conductivity type being arranged in contact with the second load terminal structure and a plurality of regions of the first conductivity type being arranged in contact with the second load terminal structure; wherein a dopant concentration in a respective central portion of the regions of the second conductivity type in the first backside emitter zone is essentially equal to a dopant concentration in a respective central portion of the regions of the second conductivity type in the second backside emitter zone; wherein a dopant concentration in a respective central portion of the regions of the first conductivity type in the first backside emitter zone is essentially equal to a dopant concentration in a respective central portion of the regions of the first conductivity type in the second backside emitter zone; wherein the first backside emitter zone exhibits each of a first emitter efficiency and a first injection efficiency at a nominal current of the power semiconductor device; wherein the second backside emitter zone exhibits each of a second emitter efficiency and a second injection efficiency at a nominal current of the power semiconductor device; wherein the first emitter efficiency differs from the second emitter efficiency by at least 1% or even by at least 5% or even by at least 10% or even by at least 20% and/or the first injection efficiency differs from the second injection efficiency by at least 1% or even by at least 5% or even by at least 10% or even by at least 20%.

For example, the above-stated relation between the first injection efficiency and the and second injection efficiency may refer to the first and second injections efficiencies at a current amounting to 0.1 times a nominal current of the power semiconductor device.

a. Alternatively, the above-stated relation between the first injection efficiency and the second injection efficiency may refer to the first and second injections efficiencies at a nominal current of the power semiconductor device or at twice the nominal current of the power semiconductor device.

For example, the backside region may further comprise a third backside zone, which comprises at least one region of the first conductivity type and a plurality of regions of the second conductivity type being arranged in alternating order in contact with the second load terminal structure, the regions of the first conductivity type and the regions of the second conductivity type. The regions of the first conductivity type and/or the regions of the second conductivity type may have a smallest lateral extension of at most 50 μm. For example, the third backside zone is arranged in an edge termination region of the semiconductor body. For example, the third backside zone is arranged below a gate runner electrode that is arranged at the front side. For example, a lateral extension of the third backside zone may amount to at least 0.5 times a vertical thickness of the drift region. Alternatively, the lateral extension of the third backside zone may amount to at least the same as the vertical thickness of the drift region or two times or even four times the vertical thickness of the drift region.

According to an embodiment, the backside region further comprises a spacer region laterally separating the second backside emitter zone from the third backside zone. The spacer region may be laterally fully surrounding the second backside emitter zone. The third region may be laterally fully surrounding the spacer region. A smallest lateral extension of the spacer region may amount to at least 0.5 times the vertical thickness of the drift region. Alternatively, the smallest lateral extension of the spacer region may amount to at least the same as the vertical thickness of the drift region or two times or even four times the vertical thickness of the drift region.

Those skilled in the art will recognize additional features and advantages upon reading the following detailed description, and upon viewing the accompanying drawings.

BRIEF DESCRIPTION OF THE DRAWINGS

The parts in the figures are not necessarily to scale. Instead, emphasis is placed upon illustrating principles of the invention. Moreover, in the figures, like reference numerals designate corresponding parts. In the drawings:

FIGS. 2-12 each schematically and exemplarily illustrate a section of a vertical cross-section of a power semiconductor device in accordance with one or more embodiments;

FIGS. 13A-E each schematically and exemplarily illustrate a section of a horizontal cross-section of a power semiconductor device in accordance with one or more embodiments;

FIGS. 14A-F each schematically and exemplarily illustrate a section of a horizontal cross-section of a power semiconductor device in accordance with one or more embodiments;

FIGS. 16A-C each schematically and exemplarily illustrate a section of a horizontal cross-section of a power semiconductor device in accordance with one or more embodiments.

DETAILED DESCRIPTION

Figure 1A:
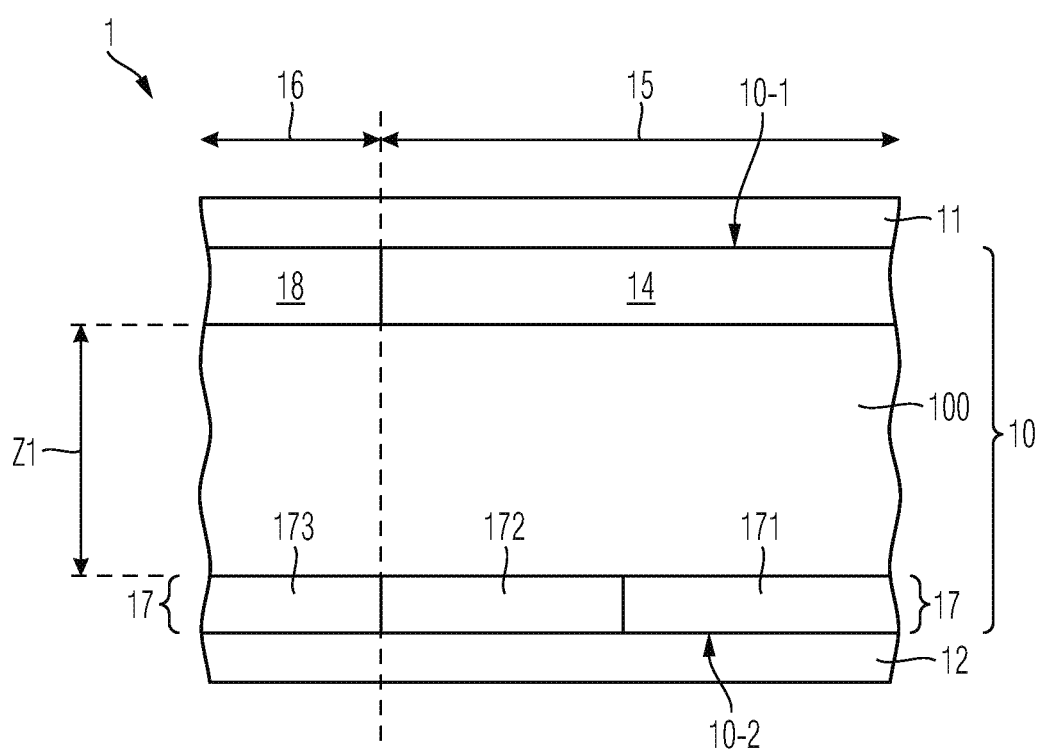
FIGS. 1A-B each schematically and exemplarily illustrate a section of a vertical cross-section of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral (or horizontal) direction X and the second lateral (or horizontal) direction Y mentioned below and/or shown in the figures can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned below and/or shown in the Figures may be a direction that is perpendicular to both the first lateral direction X and the second lateral direction Y.

In this specification, n-doped is generally referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e. g., a dielectric.

Specific embodiments described in this specification pertain to, without being limited thereto, a power semiconductor device exhibiting a single cell, a stripe cell or cellular (also referred to as "needle" or "columnar") cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, a derivative of a monolithically integrated diode cell (e.g., a monolithically integrated cell of two anti-serially connected diodes), a monolithically integrated transistor cell, e.g., a monolithically integrated IGBT or MOSFET cell and/or derivatives thereof. Such diode/transistor cells may be integrated in a power semiconductor module. A plurality of such power cells may constitute a cell field that is arranged with an active area of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V or even more, e.g., in the range from 1.2 kV to 2 kV, or up to at least 3 kV, or even up to 6 kV or more.

For example, the power semiconductor device described below may be a single semiconductor chip exhibiting a single cell configuration (such as a single diode cell), a stripe cell configuration or a cellular cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

FIG. 1A schematically and exemplarily shows a section of a vertical cross-section of a power semiconductor device 1 in accordance with one or more embodiments. The power semiconductor device 1 comprises a semiconductor body 10 having a front side 10-1 and a backside 10-2. For example, the semiconductor body 10 may comprise or consist of a silicon-based substrate, a silicon carbide-based substrate, a gallium nitride-based substrate or, e. g., another wide band gap semiconductor substrate.

The semiconductor body 10 comprises, an active area 15, which may also be referred to as an active cell area 15. The active cell area 15 may comprise one or more power cells 14, which may be configured for conducting and/or a controlling a load current between a first load terminal structure 11 arranged at the front side 10-1 of the semiconductor body 10 and a second load terminal structure 12 arranged at the backside of the semiconductor body 10. Accordingly, in accordance with some embodiments, the power semiconductor device 1 may be configured as a vertical power semiconductor device 1.

For example, the power semiconductor device 1 is or comprises at least one of: a power diode, a MOSFET, an IGBT, a reverse conducting IGBT (RC-IGBT), a high-electron-mobility transistor (HEMT), such as a gallium based HEMT, and a thyristor.

In case the power semiconductor device 1 is or comprises a power diode, the active area 15 may comprise, for example, one large power cell 14, as exemplarily illustrated in FIG. 1A. For example, the power cell 14 may include a p-doped semiconductor region that is configured as an anode region and that is in contact with a front side metallization forming part of a first load terminal structure 11. For example, the anode region may form a pn-junction with an n-doped drift region 100 of the semiconductor body 10.

Alternatively, in the case of a transistor configuration, e. g., in the form of a MOSFET or an IGBT, the active area 15 may include an active cell field 14 comprising a plurality of transistor cells, which may, for example, comprise in each case a source region, a body region, and a gate electrode (such as a trench gate electrode), the gate electrode configured for selectively switching the power semiconductor device 1 in one of a forward conducting state and a forward blocking state. The design of such active cell fields of power semiconductor devices is, as such, well known to the person skilled in the art and will therefore not be explained in further detail here.

Besides the active area 15, the power semiconductor device 1 may comprise an edge termination region 16 that extends between the active area 15 and a lateral chip edge (not illustrated) of the semiconductor body 10. For example, the edge termination region 16 may laterally surround the active area 15.

As used herein, the terms "edge termination region" and "active area" are both associated with the respective technical meaning the skilled person typically associates therewith in the context of power semiconductor devices. That is, the active area 15 is primarily configured for load current conduction and, in the case of a transistor configuration, switching purposes, whereas the edge termination region 16 primarily fulfills functions regarding reliable blocking capabilities, appropriate guidance of the electric field, and sometimes also charge carrier drainage functions, and/or further functions regarding protection and proper termination of the active area 15.

The edge termination region 16 may comprise an edge termination structure 18, which may be arranged at the front side 10-1 of the semiconductor body 10. Such an edge termination structure 18 may also be referred to as a junction termination structure or briefly as a junction termination. For example, the edge termination structure 18 may comprise one or more components arranged within the semiconductor body 10 and/or one or more components arranged above the front side surface 10-1 of the semiconductor body 10. In FIG. 1A, the edge termination structure 18 is merely schematically illustrated as a structure being arranged at the front side 10-1 inside the semiconductor body 10, without showing specific structural details.

Common examples of edge termination structures 18 are field rings (sometimes also referred to as guard rings), field plates, a combination of field rings and field plates, and a junction termination extension (JTE) edge termination structure, such as a variation-of-lateral-doping (VLD) edge termination structure. The skilled person is well acquainted with these kinds of edge termination structures as such. Therefore, they will not be explained in detail at this point.

The power semiconductor device 1 further comprises a backside region 17 being arranged inside the semiconductor body 10 at the backside 10-1. The backside region 17 comprises at least one first backside emitter zone 171 and at least one second backside emitter zone 172, wherein the first and second backside emitter zones 171, 172 are arranged inside the active area 15 of the power semiconductor device 1.

FIG. 1A exemplarily shows one first backside emitter zone 171 and one second backside emitter zone 172. However, it should be noted that in accordance with some embodiments, a plurality of first backside emitter zones 171 and/or a plurality of second backside emitter zones 172 may be provided.

Figure 1B:
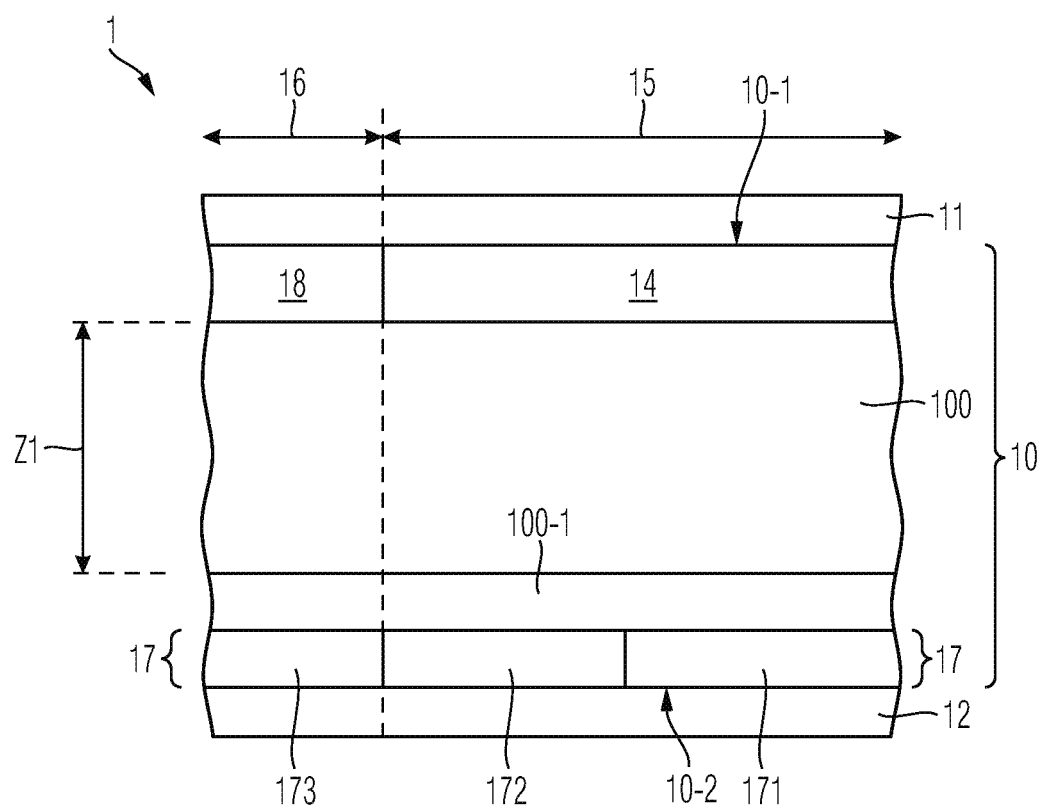

FIG. 1B schematically and exemplarily illustrates a variant embodiment, which differs from the one of FIG. 1A in that the semiconductor body 10 additionally comprises a field stop region 100-1. The field stop region 100-1 is arranged between the drift region 100 and the backside region 17 and has a higher dopant concentration of the first conductivity type than the drift region 100.

The field stop region 100-1 may exhibit one or more dopant concentration peaks. For example, the field stop region 100-1 may have come into being by means of one or more proton implantations through the back side 10-2. Such methods and variants of field stop regions, which are sometimes also referred to as buffer regions, are in principle well known to the person skilled in the art and will therefore not be discussed in further detail here.

In an embodiment, the field stop region 100-1 has been produced by means of one or more proton implantations, such that an end of range of a shallowest dopant concentration peak is located in at a depth a range from 1 μm to 4 μm below a backside surface of the semiconductor body 10. In this context, the "shallowest" peak shall designate either the only field stop peak (in case there is only one) or the field stop peak out of several field stop peaks that is located closest to the backside surface.

In an embodiment, the field stop region 100-1 has been realized by an ion implantation of donor-like atoms such as phosphorus, selenium or sulphur with a subsequent drive-in step or annealing step resulting for example in a Gaussian-like doping profile of the field stop region 100-1. In particular the implementation of a field stop region 100-1 with deep donors such as selenium atoms the temperature dependence of the hole injection by the p-short regions 1711, 1712, 1721, 1722 during the turn-off process can be reduced. For a fine-tuning of this temperature dependence additionally shallow donors can be introduced into the field stop region 100-1.

In accordance with an embodiment, a respective area extension of each of the first backside emitter zone 171 and the second backside emitter zone 172 may amount to at least 5%, such as at least 25% or even at least 40%, of an area extension of the active area 15.

The first and second backside emitter zones 171, 172 may differ from one another with regard to their backside emitter properties.

For example, the at least one first backside emitter zone 171 may exhibit each of a first emitter efficiency and a first injection efficiency at a nominal current of the power semiconductor device 1, whereas the at least one second backside emitter zone 171 may exhibit each of a second emitter efficiency and a second injection efficiency at the nominal current.

For the purposes of the present specification, the emitter efficiency is defined as the ratio of the electron current at a backside p/n or n−/n+ junction (i. e., at an interface between the field stop region 100-1 and the first backside emitter zone 171 and/or the second backside emitter region zone) and the total current, wherein this quantity is averaged over the respective first or second backside emitter zone 171, 172.

Further, for the purposes of the present specification, the injection efficiency is defined as. the ratio of the amount of injected holes during the reverse commutation of the power semiconductor device 1 and the total reverse recovery charge under softness critical conditions (i. e. at a relatively low current, e.g. 0.1 times a nominal current, and at a relatively low temperature, e.g. 25° C.). In other words the injection efficiency is the time integral over the hole current into the device 1 during reverse recovery compared to the time integral over the total current during reverse recovery, typically called Qrr, under said softness critical conditions.

Further, for the purposes of the present specification, an injected hole charge of the first backside emitter zone 171 or of the second backside emitter zone 172, respectively, is defined as the charge of the injected holes during the reverse commutation of the power semiconductor device 1 under softness critical conditions (i. e. at a relatively low current, e.g. 0.1 times a nominal current, and at a relatively low temperature, e.g. 25° C.). In other words the injection efficiency is the timely integral over the hole current into the device 1 during reverse under said softness critical conditions.

Further, for the purposes of the present specification, an average backside plasma concentration associated with the first backside emitter zone 171 or the second backside emitter zone 172, respectively, is defined as an area integral of a free electron concentration over a horizontal cross-sectional area at a distance of 1 μm from an interface between the field stop region 100-1 and the respective first or second backside emitter zone 171, 172, normalized by the area.

In accordance with one or more embodiments, the first emitter efficiency differs from the second emitter efficiency by at least 1%, such as by at least 5%, e. g. by at least 10% or even by at least 20%. Additionally or alternatively, it may be provided that the first injection efficiency differs from the second injection efficiency by at least 5%, e. g. by at least 10% or even by at least 20%.

Further, in accordance with an embodiment, the injected hole charge of the first backside emitter zone 171 differs from the injected hole charge of the second backside emitter zone 172 by at least 10%, such as, e. g., by at least 20%, or even by at least 40%.

Further, in accordance with an embodiment, the average backside plasma concentration associated with the first backside emitter zone (171) differs from the average backside plasma concentration associated with the second backside emitter zone (172) by at least 5%, such as by at least 10%, e. g, by at least 20%.

In terms of structural features, such differences between the first and second emitter and/or injection efficiencies and between the respective injected hole charges or average backside plasma concentrations may be achieved, for example, by providing inside the first and/or second backside emitter zones 171, 172 a plurality of semiconductor regions of a second conductivity type (e. g., p-type) that is complementary to a first conductivity type (e. g. n-type) of the drift region 100.

In other words, as will be explained in more detail below with reference to FIGS. 2-11, the first backside emitter zone 171 and the second backside emitter zone 172 may be configured as meta-structures, each comprising different arrangements of regions of the second conductivity type 1711, 1721, 1712, 1722 being arranged in contact with the second load terminal structure 12 and a plurality of regions of the first conductivity type 1740 being arranged in contact with the second load terminal structure 12. In some embodiments such a meta-structure 171, 172 may also be characterized by the absence of regions of the second conductivity type 1711, 1721, 1712, 1722.

FIGS. 2-11 each schematically and exemplarily illustrate a section of a vertical cross-section of a power semiconductor device 1, e. g. a power diode, in accordance with one or more embodiments. The cross-section comprises in each case a portion of the semiconductor body 10 at the backside 10-1, which includes a portion of the field stop region 100-1 and a portion of the backside region 17. The illustrated portion of the backside region 17 comprises a first backside emitter zone 171 as well as a second backside emitter zone 172. Further, a portion of the second load terminal structure 12 (in the form of a backside metallization) is shown.

The embodiments of FIGS. 2-11 differ from one another in the specific arrangements of regions of the second conductivity type 1711, 1721, 1712, 1722 and of regions of the first conductivity type 1740 inside the first and second backside emitter zones 171, 172, as will be explained in more detail in the following.

In accordance with the embodiments of each of FIGS. 2-11, at least one of the first backside emitter zone 171 and the second backside emitter zone 172 may comprise a plurality of first sectors 171-1, 172-1 and/or a plurality of second sectors 171-2, 172-2.

The first sectors 171-1, 172-1 as well as the second sectors 171-2, 172-2 may be configured such that they do not support any significant injection of charge carriers of the first conductivity type (e. g. electrons) during operation of the power semiconductor device 1.

For example, each first sector 171-1, 171-2 may comprise at least one first region 1711, 1721 of the second conductivity type, the first region 1711, 1721 being arranged in contact with the second load terminal structure 12 and having a smallest lateral extension x1, x1' of at most 50 μm, such as at most 30 μm, for example at most 10 μm.

The first regions 1711, 1721 may be configured such that they do not support any significant injection of charge carriers of the second conductivity type (e. g. holes) during operation of the power semiconductor device 1.

Further, each second sector 171-2, 172-2 may consist of a second region 1712, 1722 of the second conductivity type, the second regions 1712, 1722 being arranged in contact with the second load terminal structure 12 and having a smallest lateral extension x2, x2' of at least 50 μm, such as at least 100 μm, for example at least 200 μm. In case the second conductivity type is "p", the second regions of the second conductivity type 1712, 1722 may also be referred to as "p-short regions".

The smallest lateral extension x2, x2' of these p-short 1712, 1722 regions defines the reverse-current-induced lateral voltage drop below these regions 1712, 1722 during the turn-off process and with it the onset level of the injection of holes during the turn-off phase. Preferably, the vertical doping profile of these p-short regions 1712, 1722 in the center of these regions 1712, 1722 is approximately the same for all of these regions 1712, 1722. Alternatively, these p-regions 1712, 1722 can exhibit different vertical doping profiles.

In contrast to the first regions, 1711, 1721, the second regions 1712, 1722 may be configured such that they support injection of charge carriers of the second conductivity type (e. g. holes) during operation of the power semiconductor device 1.

Laterally in between the sectors 171-1, 172-1, 171-2, 172-2 there are regions of the first conductivity type 1740, which are also arranged in contact with the second load terminal structure 12. A lateral extension of these regions of the first conductivity type 1740 may be sufficiently large such that the regions of the first conductivity type 1740 may support injection of charge carriers of the first conductivity type (e. g. electrons) during operation of the power semiconductor device 1. For example, in some embodiments, a lateral extension of the regions of the first conductivity type 1740 may amount to at least 50 μm, such as at least 100 μm, for example at least 200 μm.

Correspondingly, in some embodiments, a lateral distance d1, d1', d2, d2' between neighboring first and/or second sectors 171-1, 172-1, 171-2, 172-2 may amounts to at least 50 μm, such as at least 100 μm, or even at least 200 μm.

In some embodiments, said regions of the first conductivity type 1740 may have a higher dopant concentration of the first conductivity type than the field stop region 100-1.

For example, the regions of the first conductivity type 1740 may have a higher dopant concentration of the first conductivity type than an average dopant concentration of the first conductivity type in the field stop region 100-1, wherein the average is taken over a vertical thickness of the field stop region 100-1. In some embodiments, the vertical thickness of the field stop region 100-1 may be larger than 2 μm, such as larger than 5 μm, or even larger than 10 μm.

For example, such relatively high dopant concentrations of the regions of the first conductivity type 1740 may have come into being by means of a laser thermal annealing (LTA) process carried out at the backside 10-1.

Additionally or alternatively, a dopant concentration of the second conductivity type of the first regions 1711, 1721 and/or a dopant concentration of the second conductivity type of the second regions 1712, 1722 may also be higher than the dopant concentration of the first conductivity type of the field stop region 100-1.

For example, first and/or second regions 1711, 1721, 1712, 1722 may have a higher dopant concentration of the second conductivity type than an average dopant concentration of the first conductivity type in the field stop region 100-1, wherein the average is taken over a vertical thickness of the field stop region 100-1. In some embodiments, the vertical thickness of the field stop region 100-1 may be larger than 2 μm, such as larger than 5 μm, or even larger than 10 μm.

In accordance with some embodiments, a dopant concentration in a respective central portion of the regions of the second conductivity type 1711, 1712 in the first backside emitter zone 171 is essentially equal to a dopant concentration in a respective central portion of the regions of the second conductivity type 1721, 1722 in the second backside emitter zone 172; and a dopant concentration in a respective central portion of the regions of the first conductivity type 1740 in the first backside emitter zone 171 is essentially equal to a dopant concentration in a respective central portion of the regions of the first conductivity type 1740 in the second backside emitter zone 172. In this context, a statement that dopant concentrations are "essentially equal" shall be understood to the effect that one dopant concentration differs from the other dopant concentration at most by a factor of 1.3, such as at most by a factor of 1.1, e. g., at most by a factor of 1.05.

Further, in accordance with some embodiments, it may be provided that the second backside emitter zone 172 differs from the first backside emitter zone 171 at least in one of the following:
the presence (or absence) of first sectors 171-1, 172-1;
the presence (or absence) of second sectors 171-2, 172-2;
a smallest lateral extension x11, x11' of first sectors 171-1, 172-1;
a smallest lateral extension x2, x2' of second sectors 171-2, 172-2;
a lateral distance d1, d1' between neighboring first sectors 171-1, 172-1;
a lateral distance d2, d2' between neighboring second sectors 171-2, 172-2;
a smallest lateral extension x1, x1' of the first regions 1711, 1721;
a lateral distance d11, d11' between neighboring first regions 1711, 1721 within the same first sector 171-1, 172-1.

For example, in the embodiment shown schematically in FIG. 2, the second backside emitter zone 172 differs from the first backside emitter zone 171 in that first or second sectors 172-1, 172-2 are entirely absent in the second backside emitter zone 172, whereas the first backside emitter zone 171 comprises a plurality of second sectors 171-2. The second sectors 171-2 consist of second regions 1712 of the second conductivity type (e. g., p-short regions), each having lateral extension x2 along the lateral direction of the cross-sections and being arranged at a lateral distance d2 from one another. A region 1740 of the first conductivity type having a higher dopant concentration than the field stop region 100-1 is in each case arranged in between two neighboring second regions 1712 of the second conductivity type.

For example, during operation of the power semiconductor device 1 according to the exemplary embodiment of FIG. 2, a relatively low plasma density of free charge carriers may result from the presence of the second sectors 171-2 in the first backside emitter zone 171. This is to say that a plasma density in the first backside emitter zone 171 and in portions of the semiconductor body 10 which are located above the first backside emitter 171 may be relatively low as compared to a plasma density in the second backside emitter zone 172 and in portions of the semiconductor body 10 which are located above the second backside emitter region 172.

As a consequence, lower static and dynamic losses may occur in the area of the first backside emitter zone 171 as compared to the area of the second backside emitter zone 172. The first backside emitter zone 171 being located closer to a center of the active area 15 than the second backside emitter zone 172 (see the portion of the edge termination region 173 shown in FIG. 2), the presence of the second sectors 171-2 may thus contribute to a temperature homogenization within the semiconductor body 10.

Further, loss generation may be increased by means of adjusting the emitter efficiency in regions of improved thermal cooling, e.g. below bond feet and/or near low loss regions, such as e.g. current sensing pads or similar.

In another aspect, not only the temperature distribution but also the softness of the device 1 may be influenced: For example, the p-shorts 171-2 may inject holes during commutation and thus provide sufficient softness.

With regard to the edge termination region 173 it should be noted that in each of the embodiments of FIGS. 2-11 the backside region 17 further comprises a third backside zone 173, which is arranged inside the edge termination region 16 The third backside zone 173 comprises a plurality of regions of the first conductivity type 1731 and a plurality of regions of the second conductivity type 1732 being arranged in alternating order in contact with the second load terminal structure 12, wherein the regions of the first conductivity type 1731 and the regions of the second conductivity type 1732 have a smallest lateral extension x4, x5 of at most 50 µm, such as at most 30 µm, for example at most 10 µm.

The third backside zone 173 may be configured such that no significant injection of electrons or holes occurs in this region during operation of the power semiconductor device 1. In this sense, the third backside zone 173 may also be referred to as a "dead area." As a result, no substantial amount of plasma will be present in the third backside zone 173 and in the portions of the semiconductor body 10 that are located above the third backside zone 173. In this way, a "high dynamic robustness (HDR)" concept may be realized by means of the third backside emitter zone(s) 173.

For example, a lateral extension x6 of the third backside zone 173 may amount to at least 0.5 times, such as at least twice, or even at least 4 times a vertical thickness z1 of the drift region 100 (see FIGS. 1A-B).

In the exemplary embodiments shown in FIGS. 2-11 the third backside zone 173 is arranged in the edge termination region 16. In some embodiments, in which the power semiconductor device 1 has a gate (e.g. in case of a MOSFET or an RC-IGBT), such a third backside zone 173 may additionally or alternatively be arranged (at least partially) below a gate runner electrode that is arranged at the front side 10-1.

In the exemplary embodiment shown in FIG. 3, both the first backside emitter zone 171 and the second backside emitter zone 172 each comprise a plurality of second sectors 171-2, 172-2. In this case, the essential difference between the first backside emitter zone 171 and the second backside emitter zone 172 is in the a smallest lateral extension x2, x2' of the respective second sectors 171-2, 172-2 and in a lateral distance d2, d2' between neighboring second sectors 171-2, 172-2: The second regions 1722 of the second conductivity type in the second backside emitter zone 172 have a larger lateral extension x2' as compared to the lateral extension x2 of the second regions 1712 of the second conductivity type in the first backside emitter zone 171. Also the lateral distance d2' between neighboring second regions 1722 in the second backside emitter zone 172 is larger as compared to the lateral distance d2 between neighboring second regions 1712 in the first backside emitter zone 171.

For example, an area ratio of the second regions of the second conductivity type 1722 in the second backside emitter zone 172 vs. the regions of the first conductivity type 1740 in the second backside emitter zone 172 may be similar or equal to an area ration of the second regions of the second conductivity type 1712 in the first backside emitter zone 171 vs. regions of the first conductivity type 1740 in the first backside emitter zone 172. Nevertheless, different emitter and/or injection efficiencies may be realized in the first backside emitter region 171 and the second backside emitter region 172 by means of a suitable design of the respective second regions 1712, 1722.

For example, the relatively coarse structure of the second sectors 172-2 (relatively wide p-shorts) in the second backside emitter zone 172 may yield a more efficient cathode in the second backside emitter zone 172 as compared to the first backside emitter zone 171. As a result, during operation, similar to what has been described above with reference to FIG. 2, the plasma density as well as the static and dynamic losses may be higher in the area of the second backside emitter zone 172 than in the area of the first backside emitter zone 171.

In this context, it should be noted that a higher plasma density may reduce the forward voltage of the diode 1. Further, in a parallel connection of areas having different plasma densities and thus different (local) forward voltages, the current preferably chooses a path through the area having a relatively low forward voltage, i.e., the second backside emitter zone 172 in the present example. As a result, higher static and dynamic losses (yielding a local increase in temperature) may occur in the second backside emitter zone 172 as compared to the first backside emitter zone 171.

Further, with reference to all embodiments described above and in the following, is should be noted with regard to softness that due to the different design of the backside emitter regions 171, 172 (which may have an influence on, e. g., an initial plasma level, but also a reverse recovery behavior), the different backside emitter regions 171, 172 may have their maximum dI/dt (which is responsible for the overvoltage) at different times. This may allow the overvoltage to be significantly reduced.

Another softness-related aspect, which may be particularly relevant for the illustrated variants having "dead areas" 171-1 as mentioned further below is the following: Here the plasma is strongly lowered at the backside 10-2 without, however, providing softness-donating holes during commutation. The possibly early and strong decrease of the plasma of free charge carriers in the backside emitter regions 171, 172 having such dead areas 171-1 can then be dampened by the respective other backside emitter region 171, 172, which at this point may still have plasma and carry current and may thus be able to dampen the oscillations. For example, the design may be such that the "unsoft region" 171, 172 is cleared from plasma before the "soft region" 171, 172 is cleared from plasma.

FIG. 4 shows another variant embodiment, wherein the lateral distance d2' between neighboring second regions 1722 in the second backside emitter zone 172 is larger as compared to the lateral distance d2 between neighboring second regions 1712 in the first backside emitter zone 171. In this embodiment, the smallest lateral extensions x2, x2' of the second sectors 171-2, 172-2 in the first backside emitter zone 171 and in the second backside emitter zone 172 are substantially equal.

In the exemplary embodiment shown in FIG. 5, the first backside emitter zone 171 comprises a plurality of first sectors 171-1, wherein each of said first sectors 171-1 comprises a plurality of first regions 1711, the first regions 1711 being arranged at a lateral distance d11 from each other of at most three times the smallest lateral extension x1 of the first regions 1711. In other words, each of the first sectors 171-1 comprises a plurality of first regions 1711 of the second conductivity type being arranged in an alternating order with a plurality of regions 1740 of the first conductivity type, similar to the third backside zone 173 in the edge termination region 16 described above.

By contrast, similar to the embodiment of FIG. 2, the second backside emitter zone 172 does not comprises any first or second sectors 172-1, 172-2. Instead, in the embodiment of FIG. 5, the second backside emitter zone 172 consists of a region of the first conductivity type 1740 forming a contiguous contact with the second load terminal structure 12 and having a lateral extension d3 of at least ten times the smallest lateral extension x1 of the first regions 1711.

For example, while the emitter efficiency may be equal or similar in the first backside emitter region 171 and the second backside emitter region 172 the presence of the relatively finely structured first sectors 171-1 may reduce the injection efficiency of the first backside emitter region 171 as compared to the second backside emitter region 172 so that no or only a low injection of free charge carriers occurs by the finely structured sectors. As a result, dynamic losses may be reduced in the area of the first backside emitter region 171 as compared to the area of the second backside emitter region 172.

For example, the finely structured first sectors 171-1 may be configured so as to support no significant injection of electrons or holes at all. In this case, the first sectors 171-1 may also be referred to as a "dead areas", similar to what has been described above with regard to the third zone 173 in the edge termination region 16.

In the exemplary embodiment shown in FIG. 6, the first backside emitter zone 171 comprises a plurality of first sectors 171-1, wherein each of said first sectors 171-1 comprises a plurality of first regions 1711, the first regions 1711 being arranged at a lateral distance d11 from each other of at most three times the smallest lateral extension x1 of the first regions 1711. The second backside emitter zone 172 comprises a plurality of second sectors 172-2 each consisting of a second region 1722 having a smallest lateral extension x2' of at least ten times the smallest lateral extension x1 of the first regions 1711.

In other words, in the embodiment of FIG. 6, the first backside emitter zone 171 is configured as in the embodiment of FIG. 5, whereas the second backside emitter zone 172 is configures as in the embodiments of FIGS. 3 and 4.

For example, the relatively coarse structuring of the second regions 1722 of the second conductivity type in the second backside emitter zone 172 may reduce the cathode efficiency as compared to the configuration of the second backside emitter zone 172 according to FIG. 5. At the same time, the relatively large lateral extension x2' of the second regions 1722 (wide p-short regions) may yield a strong injection of holes during commutation, thus improving the softness of the power semiconductor device 1.

In the first backside emitter zone 171, the relatively finely structured first sectors 171-1 may yield a similar cathode efficiency as the second regions 1722 in the second backside emitter zone 172. However, the injection efficiency may be relatively low due to the finely structured first sectors 171-1. Since no additional holes are injected, less switching losses (and hence a less significant temperature increase) may occur in this region.

In the exemplary embodiment shown in FIG. 1, the first backside emitter zone 171 is configured as in the embodiments of FIGS. 5 and 6 described above. However, in the embodiment of FIG. 7, also the second backside emitter zone 172 comprises a plurality of finely structured first sectors 172-1, wherein the first sectors 172-1 have a larger lateral extension x11' as compared to the lateral extension x11 of the first sectors 171-1 in the first backside emitter zone 171. Further, a lateral distance d1' between neighboring first sectors 172-1 in the second backside emitter zone 172 is larger than a lateral distance d1 between neighboring first sectors 171-1 in the first emitter zone 171.

In the exemplary embodiment shown in FIG. 8, the first backside emitter zone 171 comprises a plurality of second sectors 171-2 (p-shorts) as described above with reference to the first backside emitter zones 171 of the embodiments of FIGS. 2 and 3. The second backside emitter zone 172 exhibits a plurality of first sectors 172-1, each comprising a single, relatively small first region 1721 of the second conductivity type ("tiny p-shorts"). The first sectors 172-1 in the second backside emitter zone 12 are spaced apart from one another by a relatively large lateral distance d1', which exceeds the lateral distance d2 between neighboring second sectors 171-2 in the first backside emitter zone 171.

In the embodiment illustrated in FIG. 9, the second backside emitter zone 172 is configured as in the embodiment of FIG. 8. The first backside emitter zone 171 does not comprise any first or second sectors 171-1, 171-2, but consists of a contiguous region 1740 of the first conductivity type (e. g., an n++-type region).

In the exemplary embodiment shown in FIG. 10, both the second backside emitter zone 172 and the first backside emitter zone 171 exhibit a plurality of first sectors 171-1, 172-1 similar to the ones in the second backside emitter zone 172 in the embodiments of FIGS. 8 and 9 ("tiny p-shorts"). In this case, the lateral distance d1 between neighboring first regions 1711 in the first backside emitter zone 171 is relatively large and exceeds the lateral distance d1' between neighboring first regions 1721 in the second backside emitter zone 172.

In the exemplary embodiment shown in FIG. 11, each of the first backside emitter zone 171 and the second backside emitter zone 172 comprises a plurality of second sectors 171-2, 172-2 ("wide p-shorts"). Additionally, in the second backside emitter zone 172, a small first region 1721 ("tiny p-short") is arranged in the vicinity of each second region 1722. In other variant embodiments (not illustrated), a plurality of such tiny p-shorts 1721 may be arranged in the vicinity of some or all of the second regions 1722.

Figure 12:
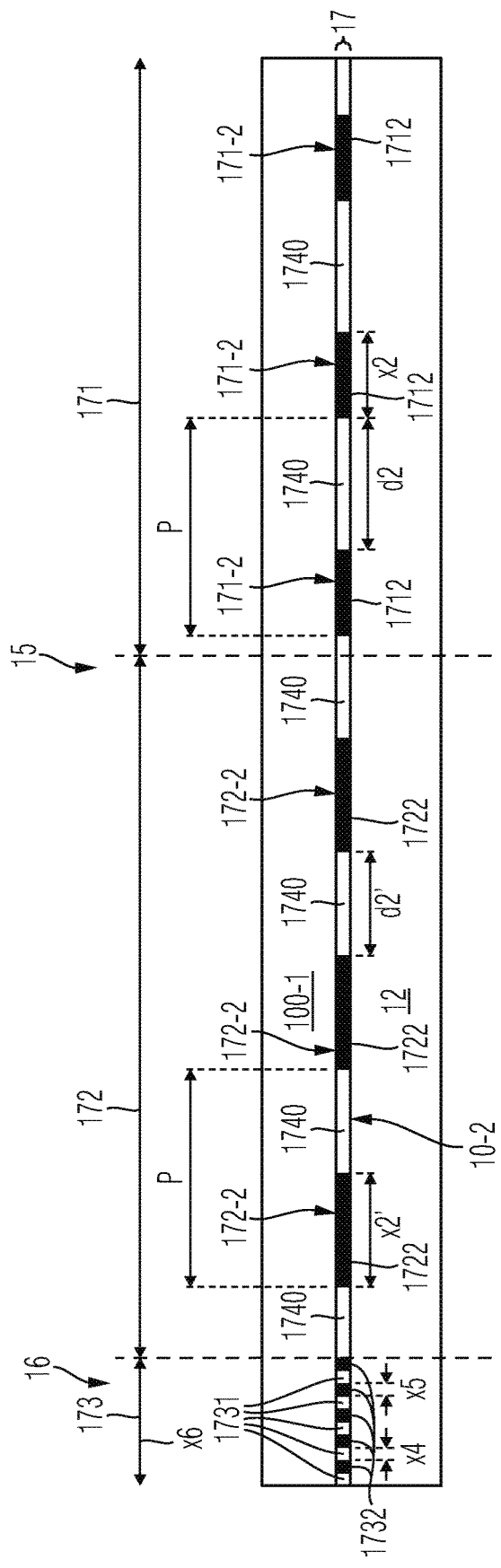

The exemplary embodiment shown in FIG. 12 is similar to the one of FIG. 3 in that both the first backside emitter zone 171 and the second backside emitter zone 172 each comprise a plurality of second sectors 171-2, 172-2, wherein a smallest lateral extension x2 of the second regions 1712 of the second conductivity type in the first backside emitter zone 171 is smaller than a smallest lateral extension x2' of the second regions 1722 of the second conductivity type in the second backside emitter zone 172. In this case, however, a pitch P between neighboring second sectors 171-2, 172-2 is essentially equal in the first backside emitter region 171 and the second backside emitter region 172, as illustrated.

For example, a p-area coverage ratio (i.e. the fraction of a total area of the first or second backside emitter zone 171, 172 that is covered with second regions 1712, 1722) may be different in the first backside emitter zone 171 as compared to a p-area coverage ratio in the second backside emitter zone 172, wherein the difference may amount to at least 2%, such as at least 5%, at least 10%, at least 20%, or even at least 40%.

Each of FIGS. 13A-E schematically and exemplarily illustrates a section of a horizontal cross-section of a power semiconductor device 1 in accordance with one or more embodiments. In each case the cross-section cuts horizontally through the backside region 17 and illustrates exemplary geometric patterns in which the second regions 1712 of the second conductivity type may be arranged within the region 1740 of the first conductivity type. In FIGS. 13A-E, the second regions 1712 inside a first backside emitter zone 171, such as a first backside emitter zone 171 of one of the embodiments described above, are shown as an example. It should be noted, however, that the same or similar geometric arrangements may also be chosen for the second regions 1722 inside one or more second backside emitter zones 172, such as a second backside emitter zone 172 of one of the embodiments described above.

As illustrated, in a horizontal cross-section, the second regions 1712 may, for example, have at least one of: a circular configuration (FIGS. 13A-B); a ring configuration (FIG. 13C); a stripe configuration (FIG. 13D); and a honeycomb configuration (FIG. 13E).

FIGS. 14A-F each schematically and exemplarily show a section of a horizontal cross-section through the backside region 17 in accordance with one or more embodiments. For example, in FIG. 14A, a small section of a first backside emitter zone 171 is shown, wherein the second regions 1712 of the second conductivity type, which are embedded in a region 1740 of the first conductivity type, have a circular configuration, as illustrated in FIG. 13B.

Figure 14A:
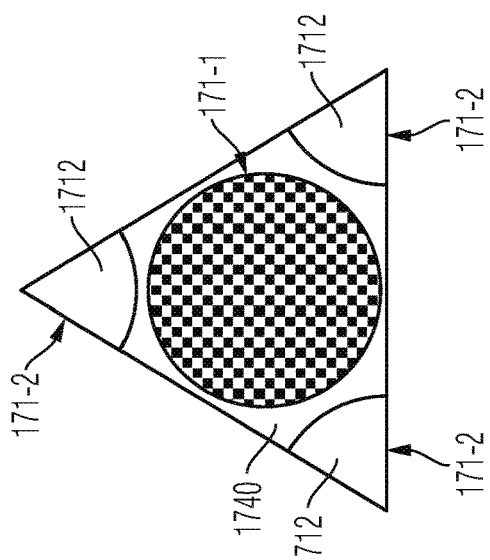
Figure 14B:
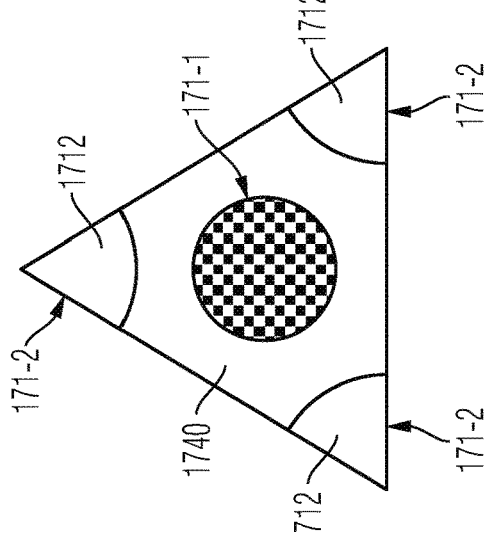

FIG. 14B differs from FIG. 14A in that a very finely structured first sector 171-1 of the kind that has been described above with reference to, e. g., the first sectors 171-1, 172-1 in FIGS. 5-6 is additionally provided in a central position between the second regions 1712. Like the second regions 1712, also the first sector 171-1 has a circular shape.

Figure 14C:
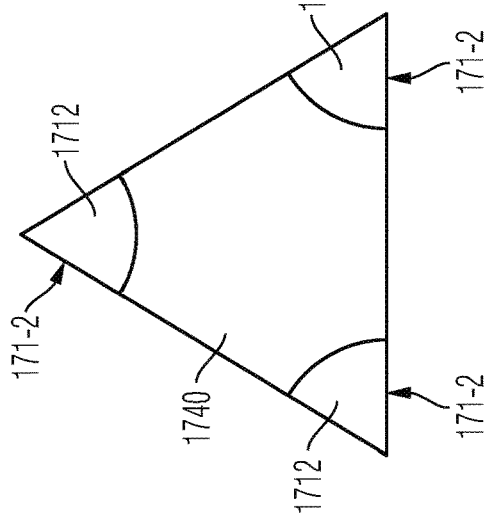

FIG. 14C shows a configuration similar to the one of FIG. 14B, the only difference being that the circular first sector 171-1 has a larger diameter and thus covers a larger area portion than in the embodiment of FIG. 14B.

For example, the finely structured first sectors 111-1 may be configured so as to support no significant injection of electrons or holes at all. In this case, the first sectors 171-1 may also be referred to as a "dead areas", similar to what has been described above with regard to the first sectors 171-1 in the embodiments of FIGS. 5-6 as well as the third zone 173 in the edge termination region 16.

In FIGS. 14D-F, some further exemplary configurations of second regions 1712 and first sectors 171-1 are shown, wherein the exemplary embodiments of FIGS. 14D-E are based on a stripe configuration as shown in FIG. 13D. The exemplary embodiment of FIG. 14F is based on a configuration as shown in FIG. 13C, wherein in the variant according to FIG. 14F a square-shaped second region 1712 is surrounded by a finely structured first sector 171-1.

It should be noted that while FIGS. 14A-F exemplarily show sections of the first backside emitter zone 171, the same or similar geometric arrangements may also be chosen for in one or more second backside emitter zones 172.

Figure 15B:
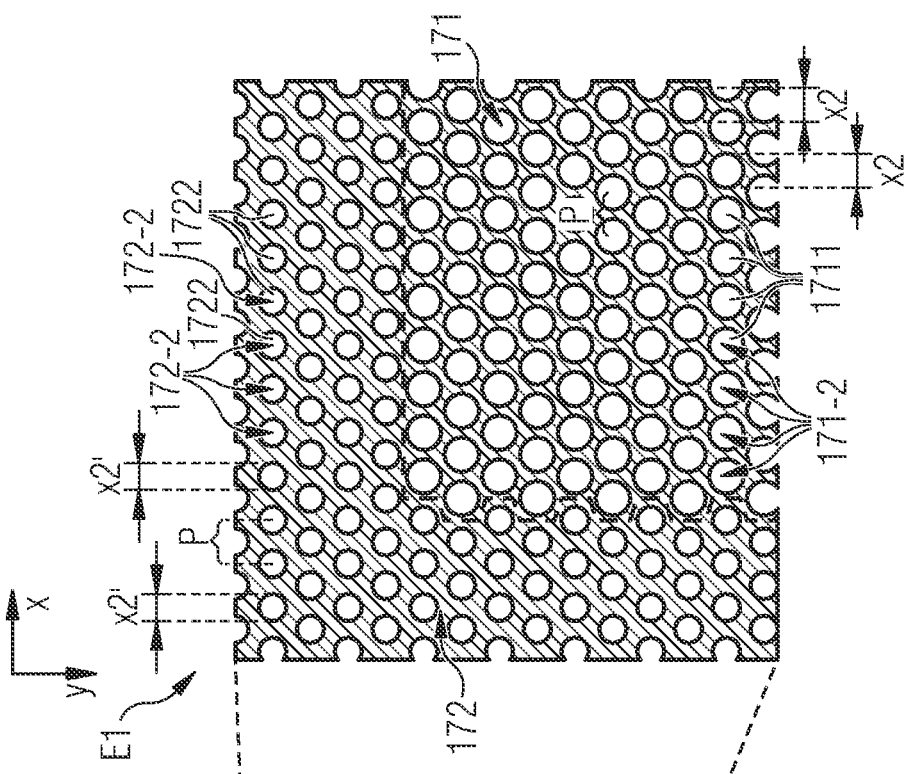
FIGS. 15A-B each schematically and exemplarily illustrate a section of a horizontal cross-section of a power semiconductor device in accordance with one or more embodiments.
Figure 15A:
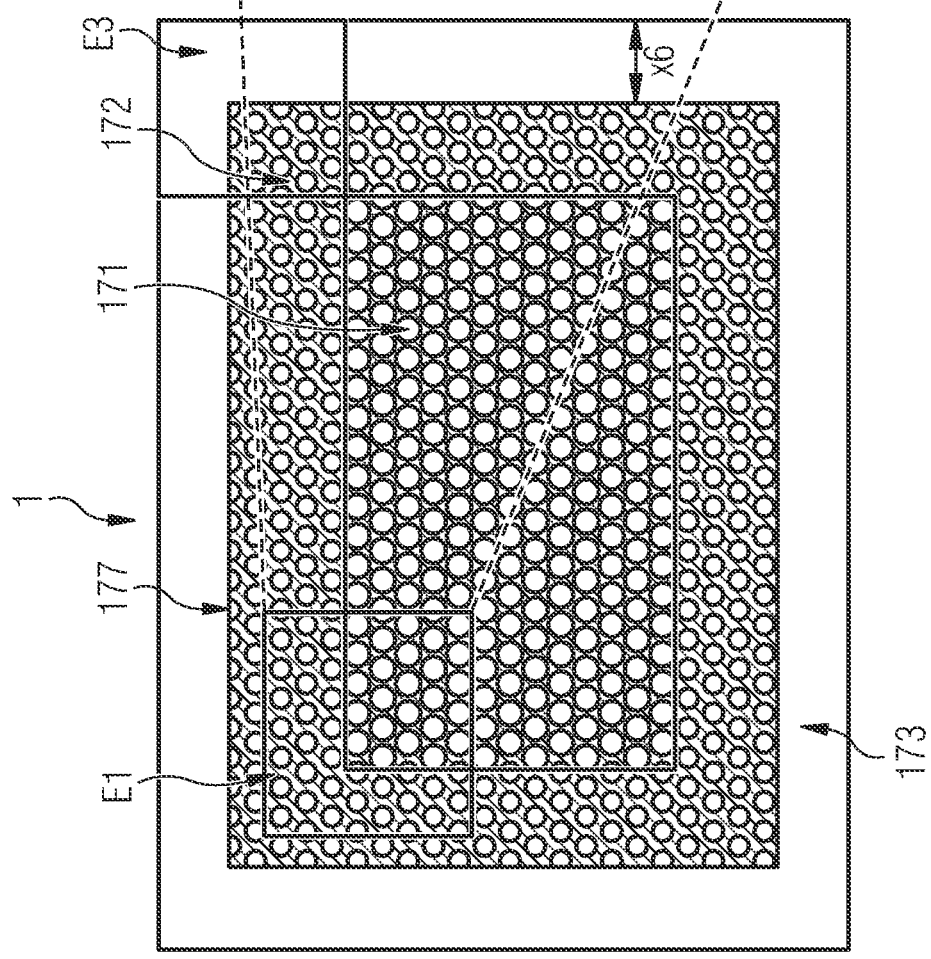

In FIGS. 15A-B another embodiment of a power semiconductor device 1 is shown. FIG. 15B is a detailed view of an excerpt E1 of FIG. 15A. FIGS. 15A-B show a power semiconductor device 1, comprising a semiconductor body 10 having a front side 10-1 and a backside 10-2; a first load terminal structure 11 being coupled to the front side 10-1 and a second load terminal structure 12 being coupled to the backside 10-2; an active area 15 of the semiconductor body 10 being configured for conducting a load current between the first load terminal structure 11 and the second load terminal structure 12; a drift region 100 of the semiconductor body 10, the drift region 100 having a first conductivity type and being configured for conducting the load current.

In particular, FIGS. 15A-B show a horizontal cross section of a backside region 17 of the semiconductor body 10, the backside region 17 being arranged at the backside 10-1 and comprising, inside the active area 15, a first backside emitter zone 171 and a second backside emitter zone 172. The first backside emitter zone 171 is arranged within the active area 15 with greater distance to an outer border 177 of the active area 15 than the second backside emitter zone 172. The first backside emitter zone 171 comprises a plurality of first sectors 171-2 each comprising a first region 1711 of a second conductivity type, the first region 1711 being arranged in contact with the second load terminal structure 12. The second backside emitter zone 172 comprises a plurality of second sectors 172-2 each comprising a second region 1722 of the second conductivity type, the second regions 1722 being arranged in contact with the second load terminal structure 12. A pitch P defining a lattice constant along at least the first lateral direction X is at least essentially equal in the first backside emitter zone 171 and the second backside emitter zone 172. More particularly, the pitch P is the same in the first backside emitter zone 171 and the second backside emitter zone 172. The first backside emitter zone 171 differs from the second backside emitter zone 172 in a smallest lateral extension x2 of the first sectors 171-2 being greater than a smallest lateral extension x2' of the second sectors 172-2. In the present embodiment, the first backside emitter zone 171 differs from the second backside emitter zone 172 in a smallest lateral extension x2 of the first regions 1711 being greater than a smallest lateral extension x2' of the second regions 1722. In the present case, the first sectors 171-2 and/or the first regions 1711 exhibit a circular configuration. In the present case, the second sectors 172-2 and/or the second regions 1722 exhibit a circular configuration.

Figures 16A, 16B:
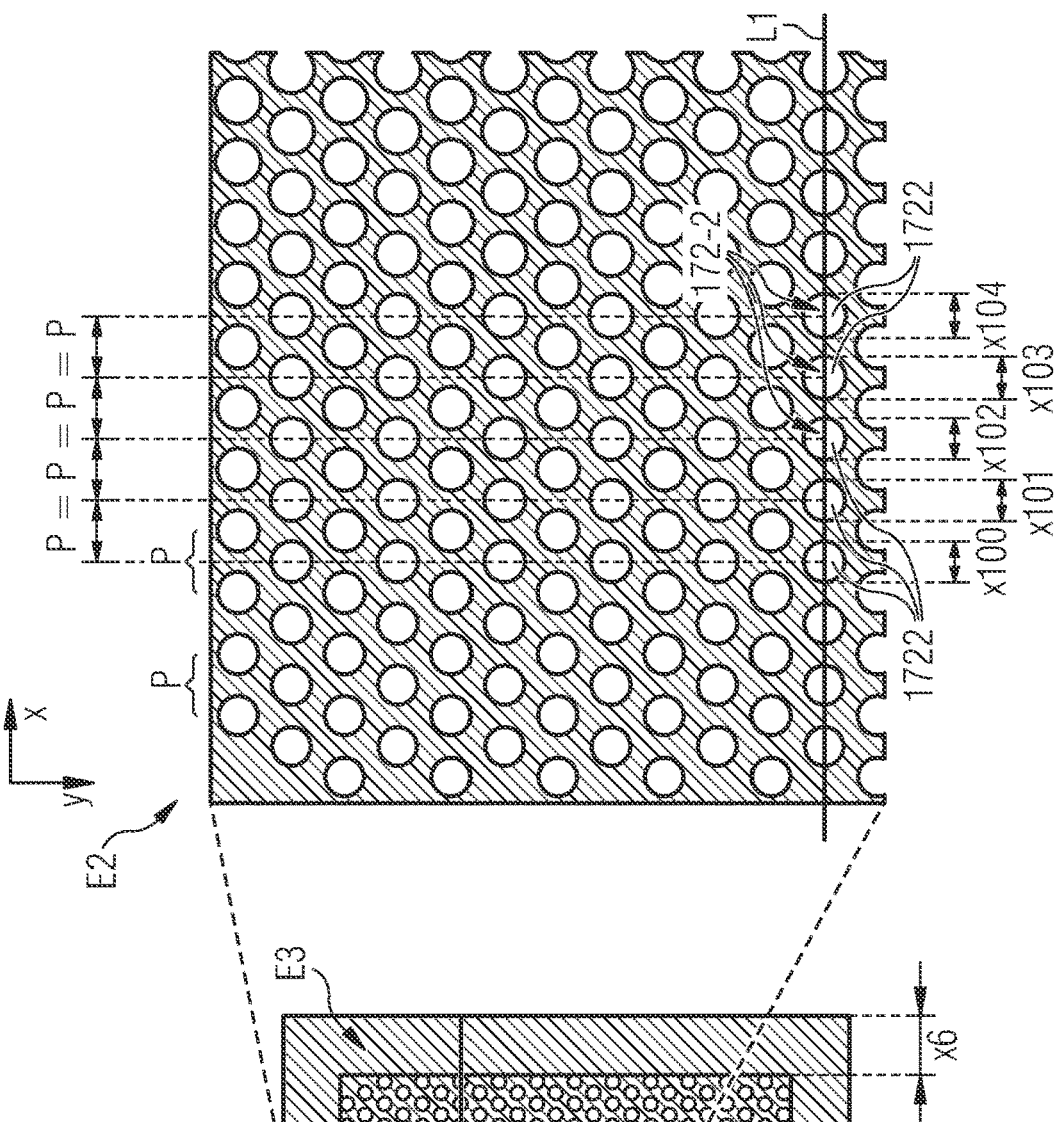

In FIGS. 16A-C another embodiment of a power semiconductor device 1 is shown. FIG. 16B is a detailed view of an excerpt E2 of FIG. 16A. FIGS. 16A-C show a power semiconductor device 1, comprising a semiconductor body 10 having a front side 10-1 and a backside 10-2; a first load terminal structure 11 being coupled to the front side 10-1 and a second load terminal structure 12 being coupled to the backside 10-2; an active area 15 of the semiconductor body 10 being configured for conducting a load current between the first load terminal structure 11 and the second load terminal structure 12; a drift region 100 of the semiconductor body 10, the drift region 100 having a first conductivity type and being configured for conducting the load current.

In particular, FIGS. 16A-C show a horizontal cross section of a backside region 17 of the semiconductor body 10, the backside region 17 being arranged at the backside 10-1 and comprising, inside the active area 15, a second backside emitter zone 172. The second backside emitter zone 172 comprises a plurality of second sectors 172-2 each comprising a second region 1722 of the second conductivity type, the second regions 1722 being arranged in contact with the second load terminal structure 12 and each having a smallest lateral extension x100, x101, x102, x103, x104. Along a thought straight line L1, for at least three neighboring second sectors 172-2 their smallest lateral extension x100-x104 is increasing strictly monotonically.

According to the embodiment depicted in FIGS. 16A-B, the second sectors 172-2 and/or the second regions 1122 exhibit a circular or round configuration. The smallest lateral dimension of five exemplary second sectors 172-2 is depicted. The smallest lateral extension x100, x101, x102, x103, x104 is increasing with increasing distance to the outer border 177 of the active area. In other words, the smallest lateral dimension of the second sectors 172-2 may exhibit a maximum in a geometrical middle of the active area 15. The smallest lateral extension may correspond as follows: x100<x101<x102<x103<x104. The Pitch P for the five exemplary second sectors 172-2 is constant. The five exemplary second sectors 172-2 are arranged according to an evenly lattice. A distance d(x10$n$) from the border 177 may increase for the five exemplary second sectors 172-2 with increasing smallest lateral extension. The distance d(x10$n$) of the five exemplary second sectors 172-2 from the border 177 may correspond as follows: d(x100)<d(x101)<d(x102)<d(x103)<d(x104).

According to the embodiment depicted in FIG. 16C, the second sectors 172-2 and/or the second regions 1722 exhibit a stripe-shaped configuration. The stripe stripe-shaped configuration may either be straight or, as depicted in FIG. 16C, each of the stripe-shaped second sectors 172-2 and/or the second regions 1722 may form a closed loop (which is only depicted in excerpt in FIG. 16C). The smallest lateral dimension of three exemplary second sectors 172-2 is depicted. The smallest lateral extension x100, x101, x102 is increasing with increasing distance to the outer border 177 of the active area. In other words, the smallest lateral dimension of the second sectors 172-2 may exhibit a maximum in a geometrical middle of the active area 15. The smallest lateral extension may correspond as follows: x100<x101<x102. The Pitch P for the three exemplary second sectors 172-2 may constant or vary along the thought line L1. The three exemplary second sectors 172-2 are arranged according to an evenly lattice. A distance d(x10$n$) from the border 177 may increase for the three exemplary second sectors 172-2 with increasing smallest lateral extension. The distance d(x10$n$) of the three exemplary second sectors 172-2 from the border 177 may correspond as follows: d(x100)<d(x101)<d(x102).

The power semiconductor device 1 depicted in 15A, 16A or 16C exhibit a third region 173 each. FIGS. 17A-D show different embodiments for the edge termination of the power semiconductor device 1. Each of FIGS. 17A-D shows a detailed view of an excerpt E3 of FIG. 15A or 16A, respectively, according to a different embodiment of the third region 173. The third region 173 may be laterally surrounding the second backside emitter zone 172. The third region 173 may be part of or overlap with an edge termination region of the power semiconductor device 1. The third backside zone 173 may be arranged below a gate runner electrode that is arranged at the front side 10-1. A lateral extension x6 of the third backside zone 173 may amount to at least 0.5 times a vertical thickness z1 of the drift region 100.

Figure 17A:
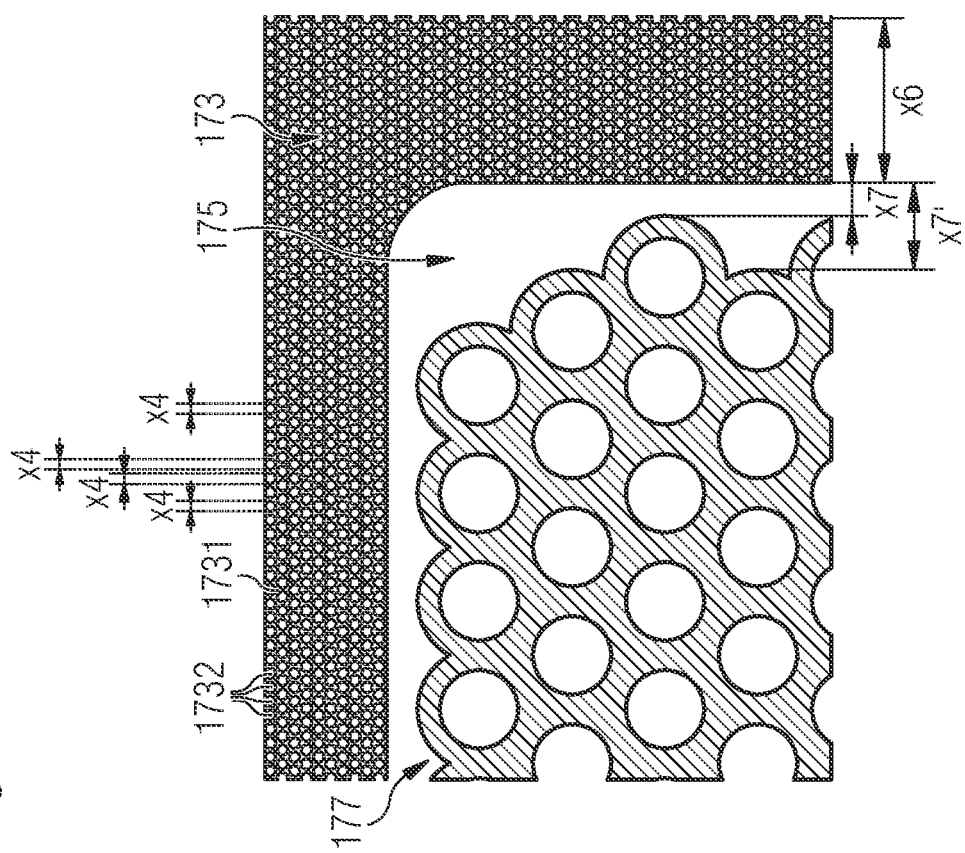
FIGS. 17A-D each schematically and exemplarily illustrate a section of a horizontal cross-section of different embodiments of a third region according to the power semiconductor devices depicted in FIGS. 15A-16C.
Figure 17B:
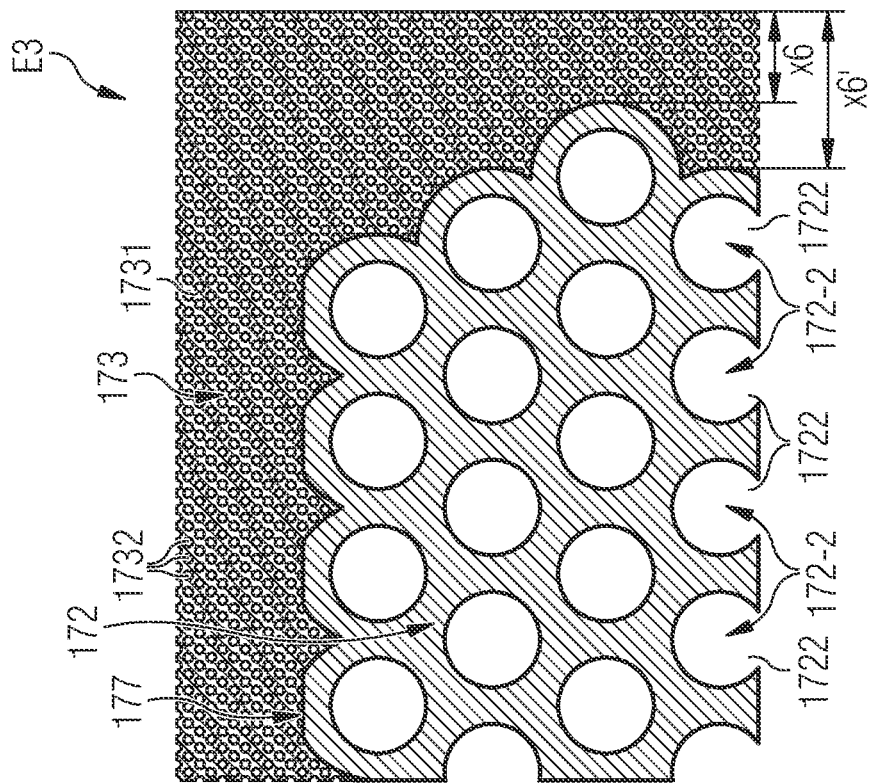

According to FIG. 17A and FIG. 17B, the third region 173 of the power semiconductor device 1 depicted in 15A or 16A, respectively, comprises one region 1731 of the first conductivity type and a plurality of regions 1732 of the second conductivity type being arranged in alternating order in contact with the second load terminal structure 12. The regions 1732 of the second conductivity type are having a smallest lateral extension of at most 50 μm. The regions 1732 of the second conductivity type may have a smallest lateral extension, which is smaller than the smallest lateral extension x1', x2', x100-x104 of the second sectors 172-2 and/or the second regions 1722 by at least a factor of 5, a factor of 10 or even a factor of 15. According to FIG. 17A and FIG. 17B, the regions 1732 of the second conductivity type exhibit a circular configuration.

According to FIG. 17A and FIG. 17B, the third region 173 of the power semiconductor device 1 depicted in 15A or 16A, respectively, comprises a plurality of regions 1731 of the first conductivity type and a plurality of regions 1732 of the second conductivity type being arranged in alternating order in contact with the second load terminal structure 12. Both, the regions 1731 of the first conductivity type and the regions 1732 of the second conductivity exhibit a stripe-shaped configuration. Each of the stripes forming the regions 1731 and regions 1732 are laterally surrounding the second backside emitter zone 172.

Figure 17D:
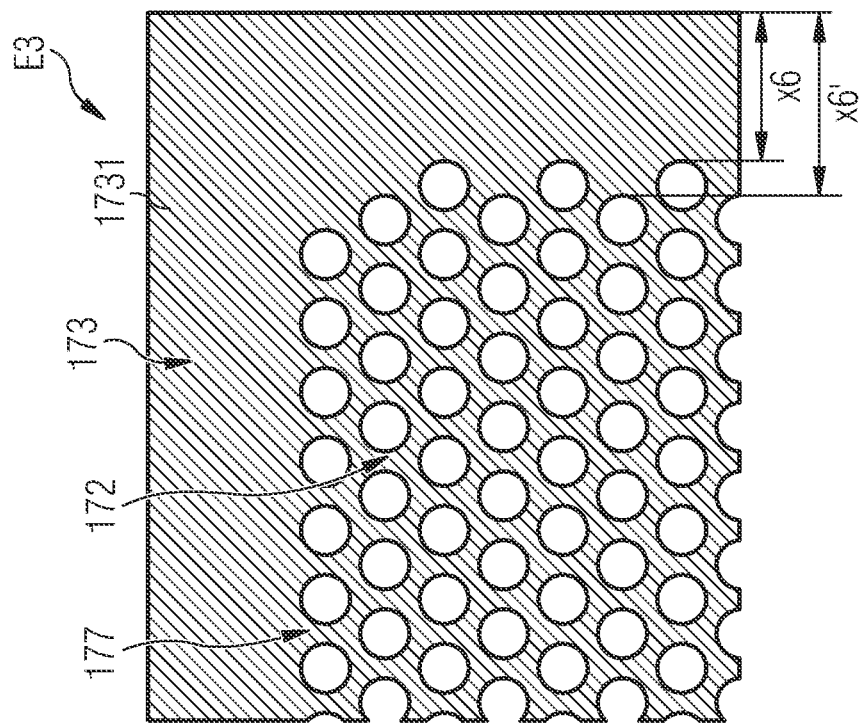
Figure 17C:
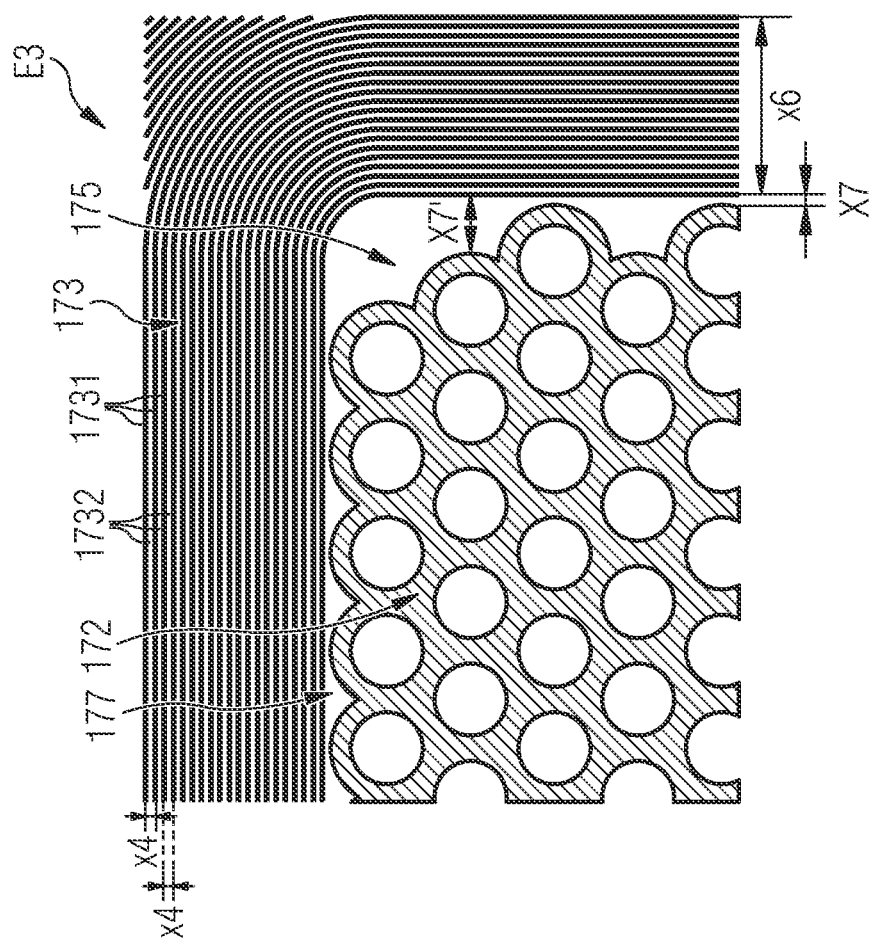

According to FIG. 17B and FIG. 17C, the power semiconductor device 1 depicted in 15A or 16A, respectively, further comprises a spacer region 175 laterally separating the second backside emitter zone 172 from the third backside zone 173. A smallest lateral extension x7 of the spacer region 175 amounts to at least 0.5 times a vertical thickness z1 of the drift region 100. The spacer region 175 is laterally surrounding the second backside emitter zone 172.

According to FIG. 17D, the third region 173 of the power semiconductor device 1 depicted in 15A or 16A, respectively, comprises only a single region 1731 of the first conductivity type. Alternatively and only according to FIG. 17D, the single region 1731 may exhibit a configuration of the second conductivity. The single region 1731 of either the first or, only according to FIG. 17D, the second conductivity type is in contact with the second load terminal structure 12. The single region 1731 of either the first or, only according to FIG. 17D, the second conductivity type is laterally surrounding the second backside emitter zone 172.

In the above, embodiments pertaining to power semiconductor devices were explained.

For example, these semiconductor devices may be based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor switch applications, currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
    a semiconductor body having a front side and a backside;
    a first load terminal structure coupled to the front side and a second load terminal structure coupled to the backside;
    an active area of the semiconductor body configured to conduct a load current between the first load terminal structure and the second load terminal structure;
    a drift region of the semiconductor body, the drift region having a first conductivity type and configured to conduct the load current; and
    a backside region of the semiconductor body, the backside region arranged at the backside and comprising, inside the active area, a first backside emitter zone and a second backside emitter zone,
    wherein the first backside emitter zone is arranged within the active area with greater distance to an outer border of the active area than the second backside emitter zone,
    wherein the first backside emitter zone comprises a plurality of first sectors each comprising at least one first region of a second conductivity type, the first region arranged in contact with the second load terminal structure,
    wherein the second backside emitter zone comprises a plurality of second sectors each comprising at least one second region of the second conductivity type, the second regions arranged in contact with the second load terminal structure,
    wherein a pitch defining a lattice constant along at least a first lateral direction is at least essentially equal in the first backside emitter zone and the second backside emitter zone,
    wherein the first backside emitter zone differs from the second backside emitter zone in a smallest lateral extension of the first sectors being greater than a smallest lateral extension of the second sectors.

2. The power semiconductor device of claim 1, wherein the first regions have a smallest lateral extension of at most 50 µm and/or the second regions have a smallest lateral extension of at least 50 µm.

3. A power semiconductor device, comprising:
a semiconductor body having a front side and a backside;
a first load terminal structure coupled to the front side and a second load terminal structure coupled to the backside;
an active area of the semiconductor body configured to conduct a load current between the first load terminal structure and the second load terminal structure;
a drift region of the semiconductor body, the drift region having a first conductivity type and configured to conduct the load current; and
a backside region of the semiconductor body, the backside region arranged at the backside and comprising, inside the active area, a second backside emitter zone,
wherein the second backside emitter zone comprises a plurality of second sectors each comprising at least one second region of the second conductivity type, the second regions arranged in contact with the second load terminal structure and each having a smallest lateral extension,
wherein, along a thought line, for at least three neighboring second sectors their smallest lateral extension increases strictly monotonically.

4. The power semiconductor device of claim 3, wherein the second sectors are arranged according to a lattice with a pitch defining a lattice constant along at least a first lateral direction, and wherein the pitch is at least essentially constant for the at least three neighboring second regions along the thought line.

5. The power semiconductor device of claim 3, wherein for the at least three neighboring second regions, their smallest lateral extension increases with increasing distance to an outer border of the active area.

6. The power semiconductor device of claim 3, wherein an area extension of each of the first backside emitter zone and the second backside emitter zone amounts to at least 5% or even at least 10% of the active area.

7. The power semiconductor device of claim 3, wherein a lateral distance between neighboring first and/or second sectors amounts to at least 50 µm.

8. The power semiconductor device of claim 3, wherein a lateral distance between neighboring first sectors in the first emitter zone is at maximum three times the smallest lateral extension of the first sector and/or a lateral distance between neighboring second sectors in the second emitter zone is at maximum three times the smallest lateral extension of the second sectors.

9. The power semiconductor device of claim 3, wherein:
the first backside emitter zone comprises a plurality of first sectors each comprising a plurality of first regions;
the first regions are arranged at a lateral distance from each other of at most three times the smallest lateral extension of the first regions; and
the second backside emitter zone comprises a plurality of second sectors each comprising a second region having a smallest lateral extension of at least ten times the smallest lateral extension of the first regions.

10. The power semiconductor device of claim 3, wherein the backside region further comprises a third backside zone which comprises at least one region of the first conductivity type and a plurality of regions of the second conductivity type arranged in alternating order in contact with the second load terminal structure, the regions of the first conductivity type and/or the regions of the second conductivity type having a smallest lateral extension of at most 50 µm.

11. The power semiconductor device of claim 10, wherein the third backside zone is arranged in an edge termination region of the semiconductor body.

12. The power semiconductor device of claim 10, wherein the third backside zone is arranged below a gate runner electrode that is arranged at the front side.

13. The power semiconductor device of claim 10, wherein a lateral extension of the third backside zone amounts to at least 0.5 times a vertical thickness of the drift region.

14. The power semiconductor device of claim 10, wherein the backside region further comprises a spacer region laterally separating the second backside emitter zone from the third backside zone.

15. The power semiconductor device of claim 14, wherein a smallest lateral extension of the spacer region amounts to at least 0.5 times a vertical thickness of the drift region.

16. The power semiconductor device of claim 3, wherein:
the first backside emitter zone exhibits each of a first emitter efficiency and a first injection efficiency;
the second backside emitter zone exhibits each of a second emitter efficiency and a second injection efficiency at the nominal current;
the first emitter efficiency differs from the second emitter efficiency by at least 1%, and/or the first injection efficiency differs from the second injection efficiency by at least 5%, and/or an injected hole charge of the first backside emitter zone differs from an injected hole charge of the second backside emitter zone by at least 10%, and/or an average backside plasma concentration associated with the first backside emitter zone differs from an average backside plasma concentration associated with the second backside emitter zone by at least 5%.

17. The power semiconductor device of claim 3, wherein in a horizontal cross-section through the first backside emitter zone and/or the second backside emitter zone, regions of the second conductivity type exhibit at least one of: a circular configuration; a ring configuration; a stripe configuration; and a honeycomb configuration.

18. The power semiconductor device of claim 3, wherein the semiconductor body comprises a field stop region arranged between the drift region and the backside region and having a higher dopant concentration of the first conductivity type than the drift region.

19. The power semiconductor device of claim 18, wherein the backside region comprises one or more regions of the first conductivity type arranged in contact with the second load terminal structure and having a higher dopant concentration of the first conductivity type than the field stop region.

20. The power semiconductor device of claim 18, wherein a dopant concentration of the second conductivity type of the first regions and/or a dopant concentration of the second regions is larger than the dopant concentration of the first conductivity type of the field stop region.

21. The power semiconductor device of claim 3, wherein the power semiconductor device is or comprises at least one of: a power diode; an RC-IGBT; a power MOSFET.

* * * * *